(12) United States Patent
Chen et al.

(10) Patent No.: US 7,547,644 B2
(45) Date of Patent: Jun. 16, 2009

(54) METHODS AND APPARATUS FOR FORMING BARRIER LAYERS IN HIGH ASPECT RATIO VIAS

(75) Inventors: Fusen Chen, Saratoga, CA (US); Ling Chen, Sunnyvale, CA (US); Walter Benjamin Glenn, Pacifica, CA (US); Praburam Gopalraja, San Jose, CA (US); Jianming Fu, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 452 days.

(21) Appl. No.: 11/264,517

(22) Filed: Nov. 1, 2005

(65) Prior Publication Data
US 2006/0057843 A1 Mar. 16, 2006

Related U.S. Application Data

(62) Division of application No. 10/894,774, filed on Jul. 20, 2004, now Pat. No. 6,974,771, which is a division of application No. 10/241,373, filed on Sep. 11, 2002, now Pat. No. 6,784,096.

(51) Int. Cl.
*H01L 21/31* (2006.01)
*C23C 16/00* (2006.01)

(52) U.S. Cl. .................. 438/758; 118/719

(58) Field of Classification Search .......... 438/637, 438/672, 676, 758, 776–778; 118/715, 719, 118/723 VE
See application file for complete search history.

(56) References Cited

U.S. PATENT DOCUMENTS

| | | | |
|---|---|---|---|
| 6,077,402 A | 6/2000 | Hong et al. | |
| 6,080,285 A | 6/2000 | Liu et al. | |
| 6,100,200 A | 8/2000 | Van Buskirk et al. | |
| 6,176,983 B1 | 1/2001 | Bothra et al. | |
| 6,193,855 B1 | 2/2001 | Gopalraja et al. | |
| 6,211,073 B1 | 4/2001 | Ahn et al. | |
| 6,265,313 B1 | 7/2001 | Huang et al. | |
| 6,277,249 B1 | 8/2001 | Gopalraja et al. | |
| 6,333,560 B1 | 12/2001 | Uzoh | |

(Continued)

FOREIGN PATENT DOCUMENTS

WO    WO 02/39500 A2    5/2002

OTHER PUBLICATIONS

U.S. Appl. No. 10/032,284, filed Dec. 21, 2001, entitled "Gas Delivery Apparatus and Method for Atomic Layer Deposition".

(Continued)

*Primary Examiner*—Brook Kebede
(74) *Attorney, Agent, or Firm*—Dugan & Dugan, PC

(57) ABSTRACT

In a first aspect, a method is provided that includes (1) forming a first barrier layer over the sidewalls and bottom of a via using atomic layer deposition within an atomic layer deposition (ALD) chamber; (2) removing at least a portion of the first barrier layer from the bottom of the via by sputter etching; and (3) depositing a second barrier layer on the sidewalls and bottom of the via within the ALD chamber. Numerous other embodiments are provided, as are systems, methods and computer program products in accordance with these and other aspects.

30 Claims, 19 Drawing Sheets

U.S. PATENT DOCUMENTS

| | | |
|---|---|---|
| 6,344,419 B1 | 2/2002 | Forster et al. |
| 6,399,479 B1 | 6/2002 | Chen et al. |
| 6,429,122 B2 | 8/2002 | Chooi et al. |
| 6,436,267 B1 | 8/2002 | Carl et al. |
| 6,498,091 B1 | 12/2002 | Chen et al. |
| 6,537,901 B2 | 3/2003 | Cha et al. |
| 6,554,969 B1 | 4/2003 | Chong |
| 6,642,146 B1 | 11/2003 | Rozbicki et al. |
| 6,762,125 B1 | 7/2004 | Kari et al. |
| 6,784,096 B2 | 8/2004 | Chen et al. |
| 6,852,194 B2 * | 2/2005 | Matsushita et al. ..... 156/345.32 |
| 6,974,771 B2 | 12/2005 | Chen et al. |
| 7,026,238 B2 | 4/2006 | Xi et al. |
| 2002/0110999 A1 | 8/2002 | Lu et al. |
| 2002/0122885 A1 | 9/2002 | Ahn |
| 2003/0000844 A1 | 1/2003 | Carl et al. |
| 2003/0049375 A1 | 3/2003 | Nguyen et al. |
| 2003/0057526 A1 | 3/2003 | Chung et al. |
| 2003/0057527 A1 | 3/2003 | Chung et al. |
| 2003/0059538 A1 | 3/2003 | Chung et al. |
| 2003/0140988 A1 | 7/2003 | Gandikota et al. |
| 2003/0141018 A1 | 7/2003 | Stevens et al. |
| 2003/0143837 A1 | 7/2003 | Gandikota et al. |
| 2004/0048461 A1 | 3/2004 | Chen et al. |
| 2005/0266682 A1 | 12/2005 | Chen et al. |

OTHER PUBLICATIONS

U.S. Appl. No. 10/193,333, filed Jul. 10, 2002, entitled "Integration of ALD Tantalum Nitride and Alpha-Phase Tantalum for Copper Metallization Application".

U.S. Appl. No. 10/199,415, filed Jul. 18, 2002, entitled "Enhanced Copper Growth With Ultrathin Barrier Layer for High Performance Interconnects".

"The Endura XP 300", Applied Materials, Inc., downloaded from www.amat.com on Sep. 10, 2002.

Office Action of U.S. Appl. No. 10/241,373 mailed Aug. 29, 2003.

Office Action of U.S. Appl. No. 11/185,248 mailed May 12, 2006.

Office Action of U.S. Appl. No. 10/894,774 mailed Jan. 21, 2005.

* cited by examiner

METHODS AND APPARATUS FOR FORMING BARRIER LAYERS IN HIGH ASPECT RATIO VIAS

This application is a division of U.S. patent application Ser. No. 10/894,774, filed Jul. 20, 2004, now U.S. Pat. No. 6,974,771 which is a division of U.S. patent application Ser. No. 10/241,373, filed Sep. 11, 2002 now U.S. Pat. No. 6,784,096. Each of the above applications is hereby incorporated by reference herein in its entirety.

FIELD OF THE INVENTION

The present invention relates to semiconductor device manufacturing, and more particularly to methods and apparatus for forming barrier layers in high aspect ratio vias employed within semiconductor devices.

BACKGROUND OF THE INVENTION

A typical integrated circuit contains a plurality of metal pathways that provide electrical power to the various semiconductor devices forming the integrated circuit, and that allow these semiconductor devices to share/exchange electrical information. Within integrated circuits, metal layers are stacked on top of one another by using intermetal or "interlayer" dielectrics that insulate the metal layers from each other.

Generally, each metal layer must form electrical contact to at least one additional metal layer. Such metal-layer-to-metal-layer electrical contact is achieved by etching a hole (i.e., a via) in the interlayer dielectric that separates the metal layers, and by filling the resulting via with a metal to create an interconnect as described further below. Metal layers typically occupy etched pathways or "lines" in the interlayer dielectric. For simplicity, as used herein, the term "via" refers to any feature such as a hole, line or other similar feature formed within a dielectric layer that assists in establishing an electrical connection through the dielectric layer to a conductive layer underlying the dielectric layer.

Because copper has a lower resistivity than aluminum, copper metals layers and interconnects have gained popularity in contrast to more conventional aluminum metal layers and interconnects. Copper atoms, however, are highly mobile in silicon dioxide and may create electrical defects in silicon. Accordingly, copper metal layers and copper interconnect vias conventionally are encapsulated with a barrier material (e.g., to prevent copper atoms from creating leakage paths in silicon dioxide or similar interlayers and/or defects in the silicon substrate on which the copper layers and interconnects are formed).

Barrier layers typically are deposited on via sidewalls and bottoms prior to copper seed layer deposition, and may include materials such as tungsten, titanium, tantalum, nitrides thereof, etc. Tantalum nitride is particularly popular due its lower resistivity and favorable adhesion properties.

As is well known, an increase in device performance is typically accompanied by a decrease in device area or an increase in device density. An increase in device density requires a decrease in the via dimensions used to form interconnects (e.g., a larger depth-to-width ratio or a larger "aspect ratio"). As via dimensions decrease, and aspect ratios increase, forming adequately thick and uniform barrier layers on the sidewalls of vias has become difficult. This problem is exacerbated within low K dielectric interlayers, as sidewall barrier layers often serve the additional role of providing mechanical strength to such low K dielectric interlayers.

Accordingly, a need exists for improved methods and apparatus for forming barrier layers in high aspect ratio vias.

SUMMARY OF THE INVENTION

In first, second and third embodiments of the invention, methods are provided for forming a barrier layer on a substrate having a metal feature, a dielectric layer formed over the metal feature, and a via having sidewalls and a bottom. The via extends through the dielectric layer to expose the metal feature.

In the first embodiment, a method includes forming a barrier layer over the sidewalls and bottom of the via using atomic layer deposition. The barrier layer has sufficient thickness to serve as a diffusion barrier to at least one of atoms of the metal feature and atoms of a seed layer formed over the barrier layer. The method further includes removing at least a portion of the barrier layer from the bottom of the via by sputter etching the substrate within a high density plasma physical vapor deposition (HDPPVD) chamber having a plasma ion density of at least $10^{10}$ ions/cm$^3$ and configured for seed layer deposition. A bias is applied to the substrate during at least a portion of the sputter etching. The method also includes depositing a seed layer on the sidewalls and bottom of the via within the HDPPVD chamber.

In the second embodiment, the method includes forming a first barrier layer over the sidewalls and bottom of the via using atomic layer deposition. At least a portion of the first barrier layer is removed from the bottom of the via by sputter etching the substrate within a high density plasma physical vapor deposition (HDPPVD) chamber having a plasma ion density of at least $10^{10}$ ions/cm$^3$ and configured for depositing a second barrier layer. A bias is applied to the substrate during at least a portion of the sputter etching. The method also includes depositing a second barrier layer on the sidewalls and bottom of the via within the HDPPVD chamber.

In the third embodiment, the method includes the steps of (1) forming a first barrier layer over the sidewalls and bottom of the via using atomic layer deposition within an atomic layer deposition (ALD) chamber; (2) removing at least a portion of the first barrier layer from the bottom of the via by sputter etching the substrate; and (3) depositing a second barrier layer on the sidewalls and bottom of the via within the ALD chamber. Numerous other embodiments are provided, as are systems, methods and computer program products in accordance with these and other aspects of the invention. Each computer program product described herein may be carried by a medium readable by a computer (e.g., a carrier wave signal, a floppy disc, a compact disc, a DVD, a hard drive, a random access memory, etc.).

Other features and aspects of the present invention will become more fully apparent from the following detailed description, the appended claims and the accompanying drawings.

DETAILED DESCRIPTION

Figure 1:
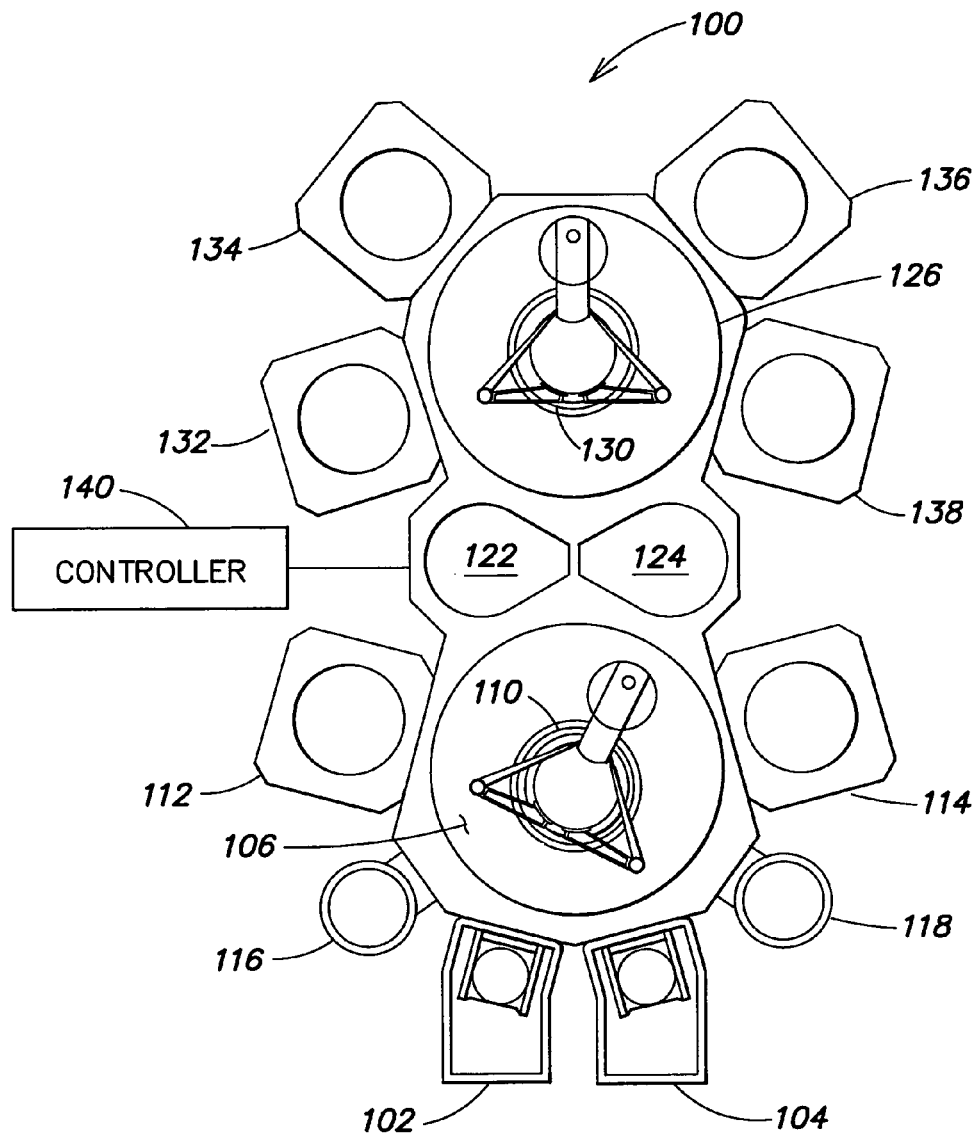
FIG. 1 is a schematic top-view of an exemplary multi-chamber processing system that may be adapted to perform the inventive processes described herein.

Embodiments of the present invention provide methods and apparatus for forming barrier layers in high aspect ratio vias (e.g., vias having aspect ratios of 3:1, 4:1, 5:1 or higher) and/or vias having via widths of about 0.065-0.2 microns or below. It will be understood that the invention also may be employed to form barrier layers in lower aspect ratio and/or wider vias. Each embodiment allows a relatively thick barrier layer to be deposited on the sidewalls of a via with little or no barrier layer coverage on the bottom of the via. Adequate diffusion resistance and/or mechanical strength thereby may be provided without significantly increasing the contact resistance of the interconnect formed with the via.

In a first embodiment of the invention, a conformal barrier layer is formed in an integrated system that includes at least (1) an atomic layer deposition (ALD) chamber for depositing the barrier layer; and (2) a high density plasma (HDP) physical vapor deposition (PVD) chamber for depositing a metal seed layer (e.g., a copper seed layer). As used herein, an HDPPVD chamber may include any PVD chamber capable of sustaining a plasma having an ion density of at least $10^{10}$ ions/cm$^3$ in a bulk region of the plasma (e.g., a region, between a target/cathode and substrate support pedestal, that is not immediately adjacent the target/cathode; although an area immediately adjacent the target/cathode also may have an ion density of at least $10^{10}$ ions/cm$^3$).

In accordance with the first embodiment and employing atomic layer deposition, the conformal barrier layer is deposited on the sidewalls and bottom of a via formed in a dielectric layer on a substrate. The substrate then is transferred to the HDPPVD seed chamber. Within the HDPPVD seed chamber, the portion of the barrier layer formed on the bottom of the via is thinned and/or removed by sputter etching the substrate (e.g., by "resputtering" the barrier layer), and a seed layer is formed on the bottom and sidewalls of the via. Resputtering of the bottom barrier layer and deposition of the seed layer may be performed sequentially or simultaneously within the HDPPVD seed chamber. Thereafter, the via may be filled (e.g., by electroplating) and/or planarized.

By performing resputtering within the seed layer deposition chamber, the need for a separate sputtering chamber is eliminated and system throughput is increased. The use of only ALD barrier layers also improves overall barrier layer uniformity, and decreases deposition on field regions of the substrate. Post metallization process times, such as chemical mechanical polishing times, thereby may be reduced.

In at least one aspect of the invention, the barrier layer comprises tantalum nitride, and the seed layer comprises copper. Other barrier layers and seed layers may be employed. These and other aspects of the first embodiment of the invention are described further below with reference to FIGS. 1-6E.

In a second embodiment of the invention, a conformal barrier layer is formed in an integrated system that includes at least (1) an atomic layer deposition (ALD) chamber for depositing a first barrier layer; and (2) a high density plasma (HDP) physical vapor deposition (PVD) chamber for depositing a second barrier layer.

In accordance with the second embodiment and employing atomic layer deposition, the conformal, first barrier layer is deposited on the sidewalls and bottom of a via formed in a dielectric layer on a substrate. The substrate then is transferred to the HDPPVD barrier layer chamber. Within the HDPPVD chamber, the portion of the first barrier layer formed on the bottom of the via is thinned and/or removed by sputter etching the substrate (e.g., by resputtering the first barrier layer), and a second barrier layer is formed on the sidewalls, and in some cases the bottom, of the via. Resputtering of the bottom, first barrier layer and deposition of the second barrier layer may be performed sequentially or simultaneously within the HDPPVD barrier layer chamber. Thereafter, the via may be coated with a seed layer and filled and/or planarized.

By employing atomic layer deposition to deposit the first barrier layer, adequate sidewall coverage may be achieved, even within high aspect ratio vias, to ensure diffusion resistance and mechanical strength (e.g., when a low K dielectric interlayer is employed). By employing HDPPVD to deposit the second barrier layer following ALD, a thin (or no) bottom barrier layer may be obtained despite the presence of thick sidewall coverage.

In at least one aspect of the invention, the first barrier layer comprises tantalum nitride, and the second barrier layer comprises tantalum. Other barrier layers may be employed. These and other aspects of the second embodiment of the invention are described further below with reference to FIGS. 1-4 and 7-8F.

In a third embodiment of the invention, a conformal barrier layer is formed in an integrated system that includes at least (1) an atomic layer deposition (ALD) chamber for depositing a first barrier layer; and (2) a sputter etch chamber for etching the first barrier layer. The sputter etch chamber may be a dedicated etch chamber, such as a Preclean™ or Reactive Preclean™ chamber manufactured by Applied Materials, Inc. of Santa Clara, Calif., or a chamber capable of performing sputter etching such as an HDPPVD chamber or the like.

In accordance with the third embodiment and employing atomic layer deposition within the ALD chamber, the conformal, first barrier layer is deposited on the sidewalls and bottom of a via formed in a dielectric layer on a substrate. The substrate then is transferred to the sputter etch chamber.

Within the sputter etch chamber, the portion of the first barrier layer formed on the bottom of the via is thinned and/or removed by sputter etching the substrate. The substrate then is transferred back to the ALD chamber, and a second barrier layer is formed on the bottom and sidewalls of the via. In at least one aspect of the invention, the second barrier layer is thinner than the first barrier layer (e.g., so that the portion of the second barrier layer on the bottom of the via does not significantly increase the contact resistance through the via). Thereafter, the via may be coated with a seed layer and filled and/or planarized.

By employing atomic layer deposition to deposit the first barrier layer, adequate sidewall coverage may be achieved, even within high aspect ratio vias, to ensure diffusion resistance and mechanical strength (e.g., when a low K dielectric interlayer is employed). Sputter etching the first ALD barrier layer from the bottom of the via and employing a second, thinner ALD barrier layer allows a thin bottom barrier layer to be obtained despite the presence of thick sidewall coverage. The use of only ALD barrier layers also improves overall barrier layer uniformity, and decreases deposition on field regions of the substrate. Post metallization process times, such as chemical mechanical polishing times, thereby may be reduced.

In at least one aspect of the invention, the first and second barrier layers comprise tantalum nitride. Other barrier layers may be employed. These and other aspects of the third embodiment of the invention are described further below with reference to FIGS. 1-4 and 9-10F.

Integrated System Overview

Before describing the above embodiments of the present invention, various apparatus that may be employed in accordance with these embodiments are described below with references to FIGS. 1-4. For example, FIG. 1 is a schematic top-view of an exemplary multi-chamber processing system 100 that may be adapted to perform the inventive processes described herein. Such a processing system may be an Endura™ system, commercially available from Applied Materials, Inc. A similar multi-chamber processing system is disclosed in U.S. Pat. No. 5,186,718, entitled "Stage Vacuum Wafer Processing System and Method," issued on Feb. 16, 1993, which is hereby incorporated by reference herein in its entirety. Other processing systems may be similarly employed.

The processing system 100 generally includes load lock chambers 102, 104 for transferring substrates into and out of the system 100. Typically, since the system 100 is under vacuum, the load lock chambers 102, 104 are adapted to "pump down" substrates introduced into the system 100 to a suitable vacuum condition. As shown in FIG. 1, the load lock chambers 102, 104 are coupled to a first transfer chamber 106 which houses a first robot 110.

The first robot 110 is adapted to transfer substrates between the load lock chambers 102, 104, and a first set of one or more substrate processing chambers 112, 114, 116, 118 (four are shown, although other numbers may be employed). Each processing chamber 112, 114, 116, 118, may be adapted to perform substrate processing operations such as cyclical layer deposition, chemical vapor deposition (CVD), physical vapor deposition (PVD), etch, pre-clean, degas, cool down, orientation and other substrate processes. The first robot 110 also transfers substrates to/from one or more pass-through chambers 122, 124. The pass-through chambers 122, 124 are coupled to a second transfer 126 which houses a second robot 130.

The second robot 130 is adapted to transfer substrates between the pass-through chambers 122, 124 and a second set of one or more processing chambers 132, 134, 136, 138. Similar to processing chambers 112, 114, 116, 118, the processing chambers 132, 134, 136, 138 can be outfitted to perform a variety of substrate processing operations, such as cyclical layer deposition, chemical vapor deposition (CVD), physical vapor deposition (PVD), etch, pre-clean, degas, and orientation, for example. Any of the substrate processing chambers 112, 114, 116, 118, 132, 134, 136, 138 may be removed from the system 100 if not necessary for a particular process to be performed by the system 100 as described further below.

The system 100 also may include a controller 140 adapted to control, for example, substrate transfer operations within the transfer chambers 106, 126 and/or the pass-through chambers 122, 124, substrate processing performed within one or more of the chambers 112-118 and 132-138, and the like. In at least one embodiment, the controller 140 is programmed to perform one or more of the inventive processes described herein that may be implemented, for example, as one or more computer program products. The controller 140 may be a system controller, a dedicated hardware circuit, an appropriately programmed general purpose computer, or any other equivalent electronic, mechanical or electromechanical device.

As described above, embodiments of the present invention employ atomic layer deposition (ALD) and/or high density plasma physical vapor deposition (HDPPVD). Accordingly, one or more of the chambers 112-118 and 132-138 may be an ALD chamber and/or a HDPPVD chamber.

Atomic Layer Deposition Chamber

Figure 2:
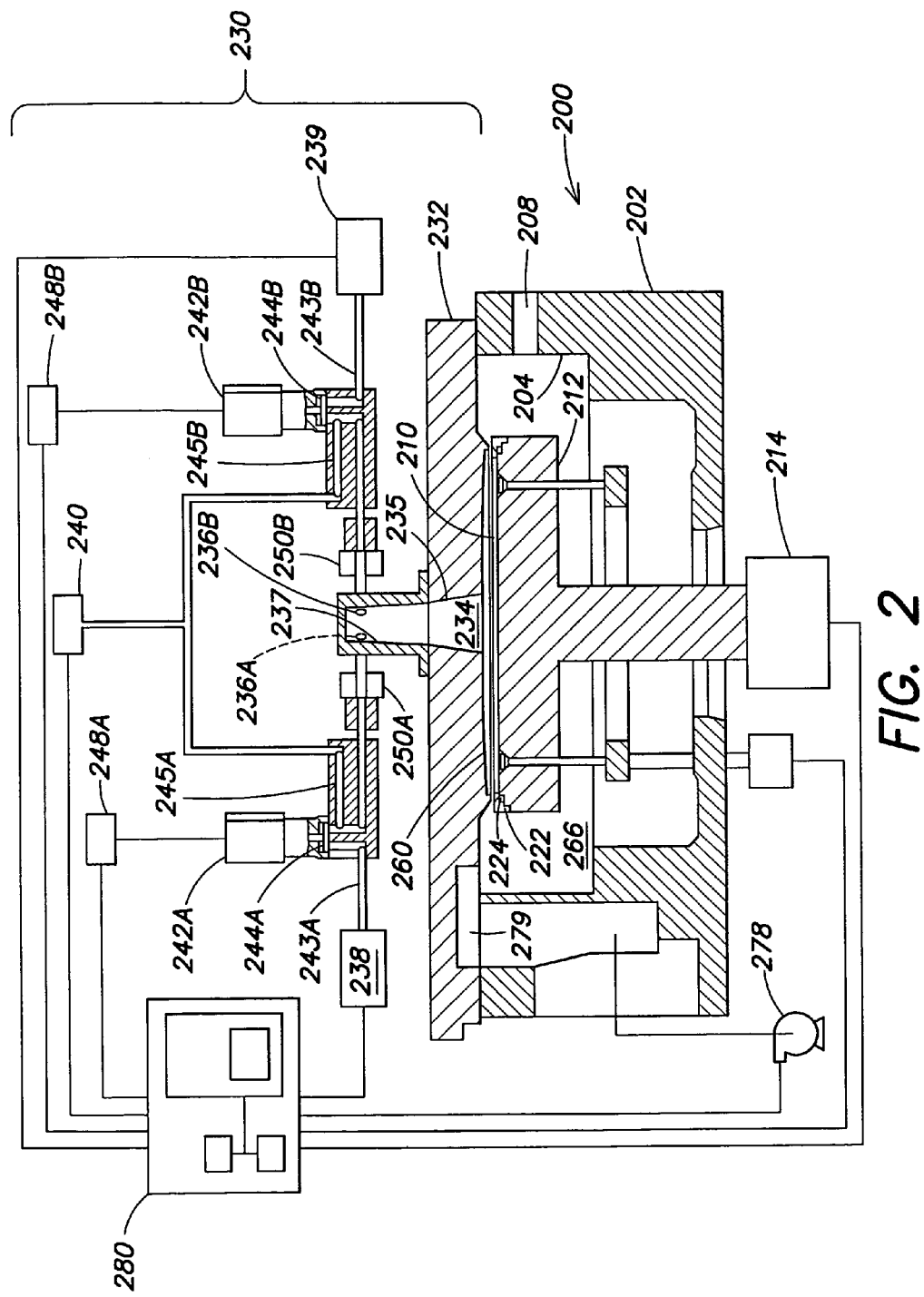
FIG. 2 is a schematic, partial cross sectional view of an exemplary atomic layer deposition (ALD) chamber that may be employed with embodiments of the present invention.

FIG. 2 illustrates a schematic, partial cross sectional view of an exemplary atomic layer deposition (ALD) chamber 200 that may be employed with embodiments of the present invention. Such a chamber 200 is available from Applied Materials, Inc., and a brief description thereof follows. A more detailed description may be found in commonly assigned U.S. patent application Ser. No. 10/032,284, entitled "Gas Delivery Apparatus and Method For Atomic Layer Deposition", filed on Dec. 21, 2001, which is hereby incorporated by reference herein in its entirety.

Referring to FIG. 2, the ALD chamber 200 includes a chamber body 202 having a slit valve 208 formed in a sidewall 204 thereof (e.g., for introducing a substrate 210 into the chamber 200) and a substrate support 212 disposed therein (e.g., for supporting the substrate 210 during processing). The substrate support 212 is mounted to a lift motor 214 to raise and lower the substrate support 212 and the substrate 210 disposed thereon. The substrate support 212 may also include a vacuum chuck, an electrostatic chuck, or a clamp ring for securing the substrate 210 to the substrate support 212 during processing. Further, the substrate support 212 may be heated using an embedded heating element (not shown), such as a resistive heater, or may be heated using radiant heat, such as heating lamps (not shown) disposed above the substrate support 212. A purge ring 222 may be disposed on the substrate support 212 to define a purge channel 224 that provides a purge gas to prevent deposition on a peripheral portion of the substrate 210.

A gas delivery apparatus 230 is disposed at an upper portion of the chamber body 202 to provide a gas, such as a process gas and/or a purge gas, to the chamber 200. A vacuum system 278 is in communication with a pumping channel 279 to evacuate gases from the chamber 200 and to help maintain a desired pressure or a desired pressure range inside a pumping zone 266 of the chamber 200.

The gas delivery apparatus 230 includes a chamber lid 232 having an expanding channel 234 formed within a central portion thereof. The chamber lid 232 also includes a bottom surface 260 extending from the expanding channel 234 to a peripheral portion of the chamber lid 232. The bottom surface 260 is sized and shaped to substantially cover the substrate 210 disposed on the substrate support 212. The expanding channel 234 has an inner diameter that gradually increases from an upper portion 237 to a lower portion 235 adjacent the bottom surface 260 of the chamber lid 232. The velocity of a gas flowing therethrough decreases as the gas flows through the expanding channel 234 due to the expansion of the gas. The decreased gas velocity reduces the likelihood that reactants adsorbed on the surface of the substrate 210 will be blown off of the substrate surface by the gas.

The gas delivery apparatus 230 also includes at least two high speed actuating valves 242A, 242B having one or more ports. At least one valve 242A, 242B is dedicated to each reactive compound. For example, a first valve is dedicated to a refractory metal-containing compound, such as tantalum or titanium, and a second valve is dedicated to a nitrogen-containing compound. When a ternary material is desired, a third valve is dedicated to an additional compound. For example, if a silicide is desired, the additional compound may be a silicon-containing compound.

The valves 242A, 242B may comprise any valve capable of precisely and repeatedly delivering short pulses of compounds into the chamber body 202. In some cases, the on/off cycles or pulses of the valves 242A, 242B may be as fast as about 100 msec or less. The valves 242A, 242B can be directly controlled by a system computer (e.g., the controller 140 of FIG. 1), such as a mainframe for example, or controlled by a chamber/application specific controller, such as a programmable logic computer (PLC) which is described in more detail in co-pending U.S. patent application Ser. No. 09/800,881, entitled "Valve Control System For ALD Chamber", filed on Mar. 7, 2001, which is hereby incorporated by reference herein in its entirety. For example, the valves 242A, 242B may be electronically controlled (EC) valves, which are commercially available from Fujikin of Japan as part number FR-21-6.35 UGF-APD.

The expanding channel 234 has gas inlets 236A, 236B to provide gas flows from the valves 242A, 242B. The gas flows from the valves 242A, 242B may be provided together and/or separately.

In one configuration, valve 242A and valve 242B are coupled to separate reactant gas sources but are preferably coupled to the same purge gas source. For example, valve 242A is coupled to reactant gas source 238 and valve 242B is coupled to reactant gas source 239, and both valves 242A, 242B are coupled to purge gas source 240. Each valve 242A, 242B includes a delivery line 243A, 243B having a valve seat assembly 244A, 244B and includes a purge line 245A, 245B. The delivery line 243A, 243B is in communication with the reactant gas source 238, 239 and is in communication with the gas inlet 236A, 236B of the expanding channel 234.

The valve seat assembly 244A, 244B of the delivery line 243A, 243B controls the flow of the reactant gas from the reactant gas source 238, 239 to the expanding channel 234. The purge line 245A, 245B is in communication with the purge gas source 240 and intersects the delivery line 243A, 243B downstream of the valve seat assembly 244A, 244B of the delivery line 243A, 243B.

Separate valve seat assemblies (not shown) may be employed to control the flow of the purge gas from the purge gas source 240 to the delivery line 243A, 243B. If a carrier gas is used to deliver reactant gases from the reactant gas source 238, 239, preferably the same gas is used as a carrier gas and a purge gas (e.g., an argon gas used as a carrier gas and a purge gas).

Each valve seat assembly may comprise a diaphragm and a valve seat. The diaphragm may be biased open or closed and may be actuated closed or open respectively. The diaphragms may be pneumatically actuated or may be electrically actuated. Examples of pneumatically actuated valves include pneumatically actuated valves available from Fujiken and Veriflow. Examples of electrically actuated valves include electrically actuated valves available from Fujiken.

Programmable logic controllers 248A, 248B may be coupled to the valves 242A, 242B to control actuation of the diaphragms of the valve seat assemblies of the valves 242A, 242B. Pneumatically actuated valves may provide pulses of gases in time periods as low as about 0.020 seconds. Electrically actuated valves may provide pulses of gases in time periods as low as about 0.005 seconds. An electrically actuated valve typically requires the use of a driver coupled between the valve and the programmable logic controller. Additional details regarding the valves 242A, 242B and operation thereof are provided in previously incorporated U.S. patent application Ser. No. 10/032,284, entitled "Gas Delivery Apparatus and Method For Atomic Layer Deposition", filed on Dec. 21, 2001.

The delivery lines 243A, 243B of the valves 242A, 242B may be coupled to the gas inlets 236A, 236B through gas conduits 250A, 250B. The gas conduits 250A, 250B may be integrated or may be separate from the valves 242A, 242B. In one aspect, the valves 242A, 242B are coupled in close proximity to the expanding channel 234 to reduce any unnecessary volume of the delivery line 243A, 243B and the gas conduits 250A, 250B between the valves 242A, 242B and the gas inlets 236A, 236B.

In a particular embodiment, a TaN barrier layer is formed by cyclically introducing PDMAT and ammonia to the substrate surface. Other exemplary tantalum-containing compounds include: t-butylimino tris(diethylamino) tantalum (TBTDET); pentakis (ethylmethylamino); tantalum (PEMAT); pentakis (diethylamino) tantalum (PDEAT); t-butylimino tris(diethyl methylamino) tantalum (TBTMET); t-butylimino tris(dimethyl amino) tantalum (TBTDMT); bis (cyclopentadienyl) tantalum trihydride ($(Cp)_2TaH_3$); bis (methylcyclopentadienyl) tantalum trihydride ($(CpMe)_2TaH_3$); derivatives thereof; and combinations thereof. Other exemplary nitrogen-containing compounds include: hydrazine; methylhydrazine; dimethylhydrazine; t-butylhydrazine; phenylhydrazine; azoisobutane; ethylazide; derivatives thereof; and combinations thereof.

To initiate the cyclical deposition of the TaN layer, a carrier/inert gas such as argon is introduced into the ALD chamber 200 to stabilize the pressure and temperature therein. The carrier gas is allowed to flow continuously during the deposition process such that only the argon flows between pulses of each compound. A first pulse of PDMAT is provided from the gas source 238 at a flow rate between about 100 sccm and about 400 sccm, with a pulse time of about 0.6 seconds or less after the chamber temperature and pressure have been stabilized at about 200° C. to about 300° C. and about 1 Torr to about 5 Torr. A pulse of ammonia is then provided from the gas source 239 at a flow rate between about 200 sccm and about 600 sccm, with a pulse time of about 0.6 seconds or less. Other flow rate ranges may be employed such as about 50 to 200 sccm for the Ta-containing compound and about 1000-

3000 sccm for the nitrogen containing compound. Other pulse times, temperature ranges and pressures also may be employed.

A pause between pulses of PDMAT and ammonia is about 1.0 second or less, preferably about 0.5 seconds or less, more preferably about 0.1 seconds or less. In various aspects, a reduction in time between pulses at least provides higher throughput. As a result, a pause after the pulse of ammonia is also about 1.0 second or less, about 0.5 seconds or less, or about 0.1 seconds or less. Argon gas flowing between about 100 sccm and about 1000 sccm, such as between about 100 sccm and about 400 sccm, is continuously provided from the gas source 240 through each valve 242A, 242B. In one aspect, a pulse of PDMAT may still be in the chamber when a pulse of ammonia enters. In general, the duration of the carrier gas and/or pump evacuation should be long enough to prevent the pulses of PDMAT and ammonia from mixing together in the reaction zone.

The heater temperature is maintained between about 100° C. and about 300° C. at a chamber pressure between about 1.0 and about 5.0 Torr. Each cycle (which includes a pulse of PDMAT, a pause, a pulse of ammonia, and a pause) provides a tantalum nitride layer having a thickness between about 0.3 Å and about 1.0 Å. The alternating sequence cycles may be repeated until the desired thickness is achieved, which in at least one embodiment of the invention is less than about 20 Å, such as about 10 Å. Accordingly, the deposition method requires between about 10 and 70 cycles, more typically between about 20 and 30 cycles. In one or more other embodiments of the invention, the desired thickness may be greater than about 50 Å, such as about 60 Å-65 Å or more. Accordingly, the deposition method requires significantly more cycles (e.g., between about 50 and 220 cycles). Other barrier layers, including ternary barrier layers such as titanium silicon nitride may be similarly deposited, as described for example, in U.S. patent application Ser. No. 10/193,333, filed Jul. 10, 2002 and titled "Integration of ALD Tantalum Nitride and Alpha-Phase Tantalum for Copper Metallization Application" which is hereby incorporated by reference herein in its entirety.

First Exemplary High Density Plasma Physical Vapor Deposition Chamber

Figure 3A:
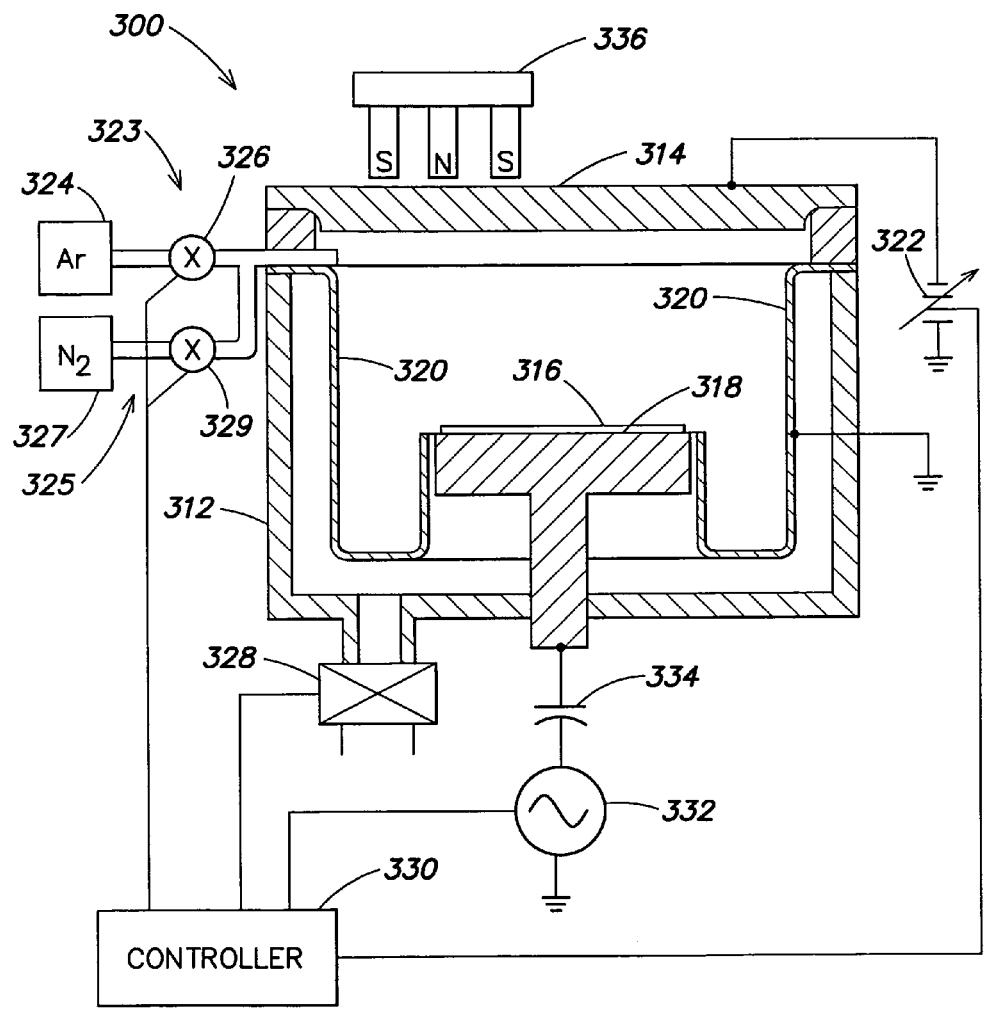
FIG. 3A is a schematic cross sectional view of a first exemplary high density plasma physical vapor deposition (HDPPVD) chamber that may be employed with embodiments of the present invention.

FIG. 3A illustrates a schematic cross sectional view of a first exemplary high density plasma physical vapor deposition (HDPPVD) chamber 300 that may be employed with embodiments of the present invention. The chamber 300 is of a type sometimes referred to as a self ionizing plasma (SIP™) chamber, available from Applied Materials, Inc.

With reference to FIG. 3A, the chamber 300 includes a sealable chamber 312, and a target 314 installed at the top of the chamber 312. The target 314 comprises a material, usually a metal, to be sputter deposited on a substrate 316 held on a pedestal 318. For example, in the first embodiment of the invention described below with reference to FIGS. 5-6E, the target 314 may comprise copper, a copper alloy, ruthenium, a ruthenium alloy, etc. (e.g., for forming a seed layer). In the second embodiment of the invention described below with reference to FIGS. 7-8F, the target 314 may comprise tantalum, tungsten, titanium, etc. (e.g., for forming a barrier layer).

A shield 320 installed within the chamber 312 protects walls of the chamber 312 from material sputtered from the target 314 and provides a grounding anode. A variable (DC) power supply 322 is connected to the target 314 for supplying power thereto.

A working gas supply 323, which includes a working gas source 324 and a first mass flow controller 326, supplies a working gas (typically the chemically inactive gas argon) to the chamber 312. (Though not required for the present invention, if reactive sputtering is to be performed to sputter-deposit a metal nitride layer, such as TaN, a second gas supply 325 may be provided, including a nitrogen gas source 327 and a second mass flow controller 329.) The chamber 312 is shown as receiving argon (and nitrogen) near the top of the chamber 312, but may be reconfigured to receive such gases at other locations, such as near the bottom of the chamber 312. A pump 328 is provided to pump out the chamber 312 to a pressure at which sputtering is performed; and an RF power source 332 is connected to the pedestal 318 through a coupling capacitor 334 (e.g., for biasing the substrate 316 during sputtering).

A controller 330 is provided to control operation of the chamber 300. The controller 330 is operatively connected to control the DC power supply 322, the first mass flow controller 326, the second mass flow controller 329, the pump 328, and the RF power supply 332. The controller 330 similarly may be coupled to control the position and/or temperature of the pedestal 318. For example, the controller 330 may control the distance between the pedestal 318 and the target 314, as well as heating and/or cooling of the pedestal 318. The controller 330 may be implemented as the controller 140 of the system 100 of FIG. 1 or as a separate controller (which may or may not communicate with the controller 140).

To promote efficient sputtering, a magnetron 336 may be rotationally mounted above the target 314 to shape the plasma. The magnetron 336 may be of a type which produces an asymmetric magnetic field which extends deep into the chamber 312 (e.g., toward the pedestal 318), to enhance the ionization density of the plasma, as disclosed in U.S. Pat. No. 6,183,614. U.S. Pat. No. 6,183,614 is incorporated herein by reference in its entirety. Typical ionized metal densities may reach $10^{10}$ to $10^{11}$ metal ions/cm$^3$ (e.g., in a bulk region of the plasma) when such asymmetric magnetic fields are employed. In such systems, ionized metal atoms follow the magnetic field lines which extend into the chamber 312, and thus coat the substrate 316 with greater directionality and efficiency. The magnetron 336 may rotate, for example, at 60-100 rpm. Stationary magnetic rings may be used instead of the rotating magnetron 336.

In operation, argon is admitted into the chamber 312 from the working gas supply 323 and the DC power supply 322 is turned on to ignite the argon into a plasma. Positive argon ions thereby are generated, and the target 314 is biased negatively relative to the grounded shield 320. These positively charged argon ions are attracted to the negatively charged target 314, and may strike the target 314 with sufficient energy to cause target atoms to be sputtered from the target 314. Some of the sputtered atoms strike the substrate 316 and are deposited thereon thereby forming a film of the target material on the substrate 316.

A DC self bias of the substrate 316 results from operation of the RF power supply 332, and enhances efficiency of sputter deposition (e.g., by attracting ionized target atoms which strike the substrate 316 with more directionality). As stated, the use of asymmetric magnetic fields increases ionized metal densities. A larger fraction of sputtered target atoms thereby strike the substrate 316 (with greater directionality).

Within the chamber 300, sputtering typically is performed at a pressure of about 0.1-2 milliTorr. Other pressure ranges may be employed. The power applied to the target 314 may be, for example, about 18 kW and the RF bias signal applied to the pedestal 318 may be about 250 W or less (although other target powers and RF biases may be used).

If reactive sputtering is to be performed, nitrogen is flowed into the chamber 312 from the second gas supply 325 together with argon provided from the working gas supply 323. Nitrogen reacts with the target 314 to form a nitrogen film on the target 314 so that metal nitride is sputtered therefrom. Additionally, non-nitrided atoms are also sputtered from the target 314. These atoms can combine with nitrogen to form metal nitride in flight or on the substrate 316.

Second Exemplary High Density Plasma Physical Vapor Deposition Chamber

Figure 3B:
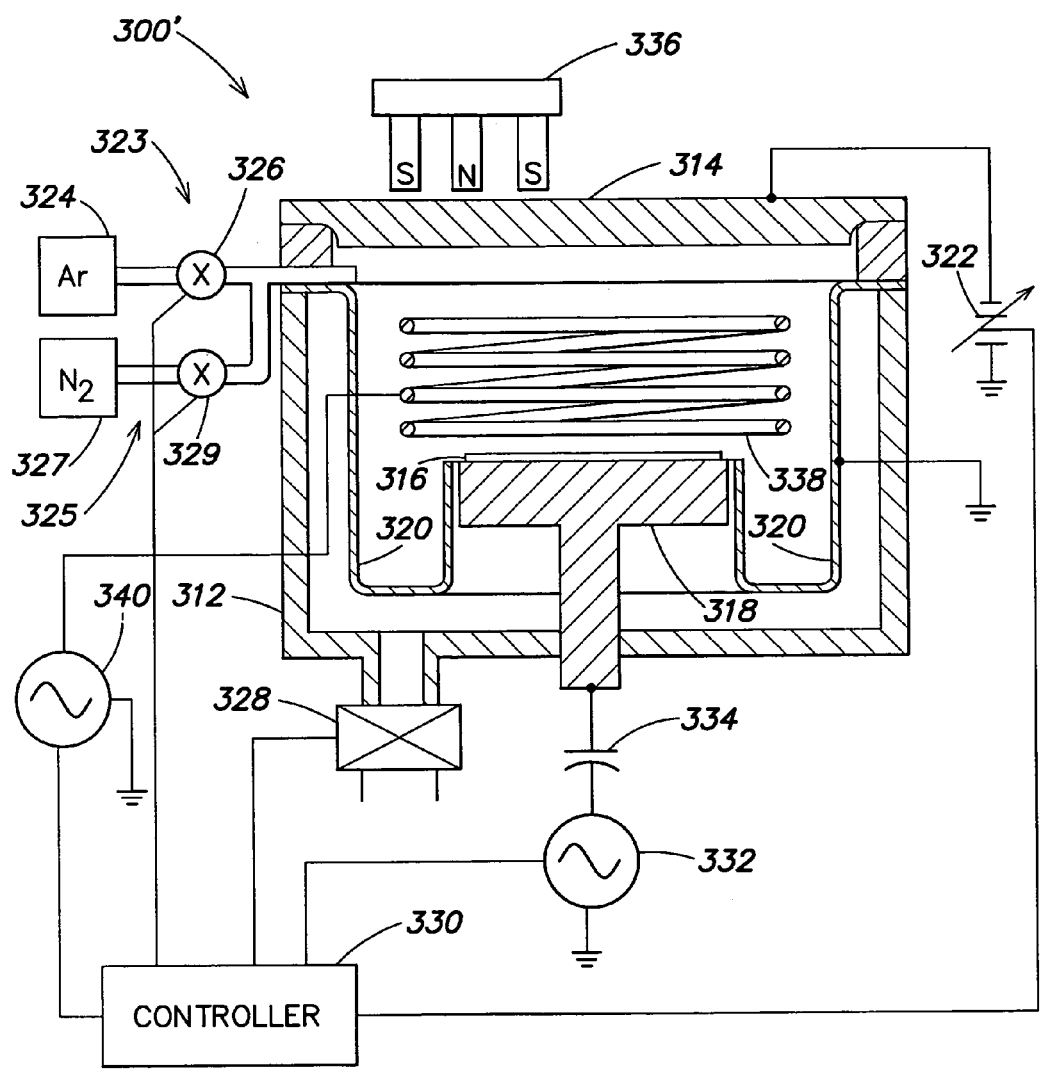
FIG. 3B is a schematic cross-sectional view of a second HDPPVD chamber that may be employed with embodiments of the present invention.

FIG. 3B is a schematic cross-sectional view of a second HDPPVD chamber 300' that may be employed with embodiments of the present invention. The chamber 300' of FIG. 3B may have all of the components described above in connection with the chamber 300 of FIG. 3A. In addition the chamber 300' includes a coil 338 which is disposed within the chamber 312 and surrounds a portion of the interior volume of the chamber 312. The coil 338 may comprise a plurality of coils, a single turn coil, a single turn material strip, or any other similar configuration. The coil 338 is positioned along the inner surface of the chamber 312, between the target 314 and the pedestal 318.

An RF power source 340 is connected to the coil 338 and is controlled by the controller 330. During sputter-deposition operation of the chamber 300', the RF power source 340 is operated to energize the coil 338, to enhance the plasma within the chamber 312 (by ionizing target atoms sputtered from the target 314). In at least one embodiment, the coil 338 may be energized at a frequency of about 2 MHz at a power level of about 1-3 kW. Other frequencies and/or powers may be used. As with the chamber 300 of FIG. 3A, metal ion densities can reach about $10^{10}$-$10^{11}$ metal ions/cm³ (e.g., in a bulk region of the plasma). However, because of the energy provided by the coil 338, high metal ion densities may be provided over a wider region of the plasma of the chamber 300' of FIG. 3B than for the plasma of the chamber 300 of FIG. 3A. The chamber pressures employed in the chamber 300' of FIG. 3B may be similar to those described above in connection with the chamber 300 of FIG. 3A. As was the case with the chamber 300 of FIG. 3A, stationary ring magnets may be used in the chamber 300' of FIG. 3B in place of the rotating magnetron 336. A chamber similar to the chamber 300' is available from Applied Materials, Inc., under the name EnCoRe or SIP™ EnCoRe.

Third Exemplary High Density Plasma Physical Vapor Deposition Chamber

Figure 3C:
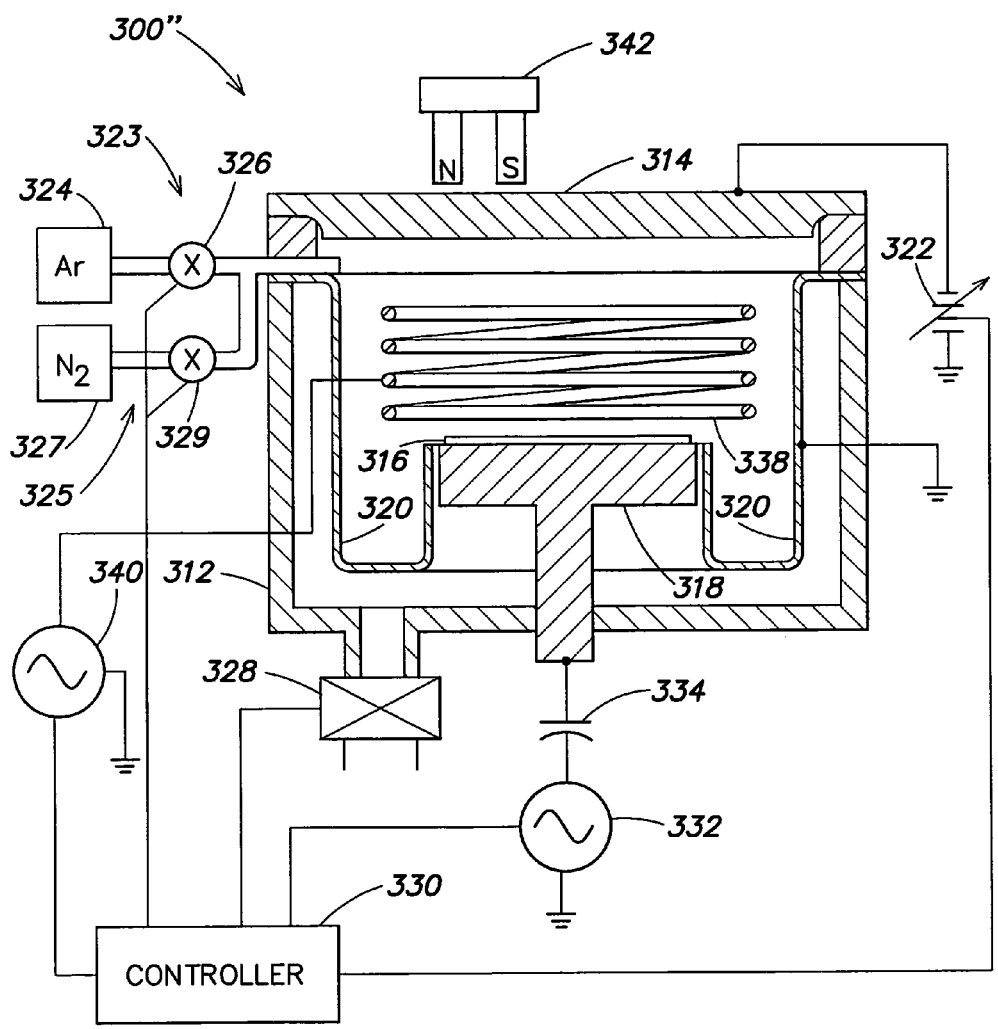
FIG. 3C is a schematic cross-sectional view of a third HDPPVD chamber that may be employed with embodiments of the present invention.

FIG. 3C is a schematic cross-sectional view of a third HDPPVD chamber 300" that may be employed with embodiments of the present invention. The chamber 300" of FIG. 3C may have all the components of the chamber 300' of FIG. 3B, except that in place of the asymmetric magnetron 336 shown in FIG. 3B, a balanced magnetron 342 (FIG. 3C) may be provided. The magnetic field provided by the balanced magnetron 342 does not extend as far into the chamber 312 as the magnetic field provided by the asymmetric magnetron 336. The chamber 300" of FIG. 3C therefore is operated at a higher pressure (e.g., about 10-100 milliTorr) so that metal atoms sputtered from the target 314 thermalize and have a greater opportunity for ionization. That is, at the higher pressure at which the chamber 300" operates, metal atoms sputtered from the target 314 experience more collisions (e.g., have a smaller mean free path between collisions) and due to increased collisions have more random motion or a longer transit time within the plasma of the chamber 300" and thus more opportunity to ionize. Metal ion densities within the chamber 300" may reach about $10^{10}$-$10^{11}$ metal ions/cm³ (e.g., in a bulk region of the plasma), but over a larger volume than in the chamber 300 of FIG. 3A.

As in the case of the chambers 300, 300', stationary ring magnets may be employed in the chamber 300" of FIG. 3C. The chamber 300" may be similar to an Ionized Metal Plasma (IMP) Vectra™ chamber, available from Applied Materials, Inc.

Fourth Exemplary High Density Plasma Physical Vapor Deposition Chamber

Figure 4:
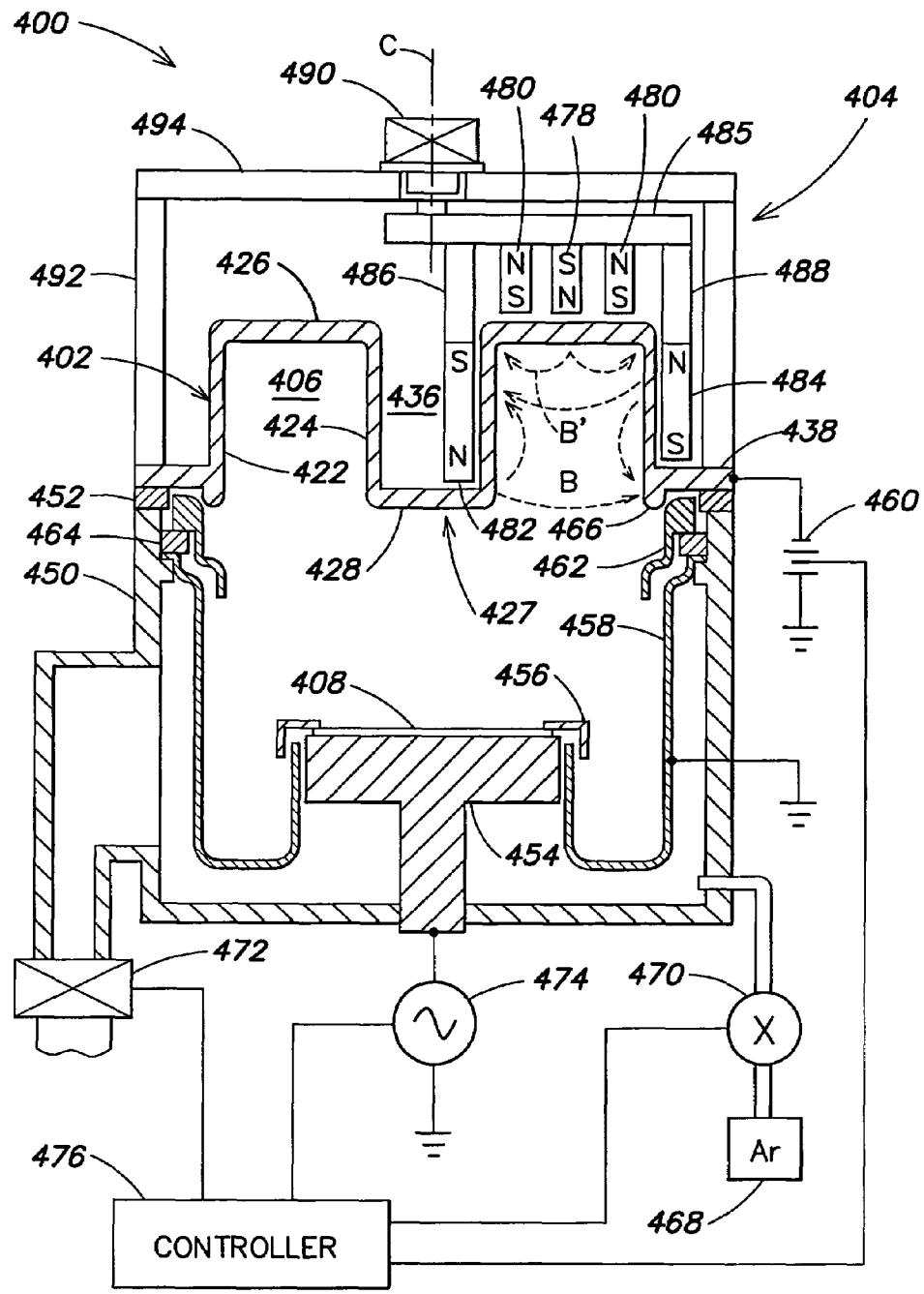
FIG. 4 is a schematic cross-sectional view of a fourth HDPPVD chamber that may be employed with embodiments of the present invention.

FIG. 4 is a schematic cross-sectional view of a fourth HDPPVD chamber 400 that may be employed with embodiments of the present invention. The chamber 400 includes a specially shaped target 402 and a magnetron 404. The target 402 or at least its interior surface is composed of the material to be sputter deposited (e.g., copper, ruthenium, tantalum, titanium, tungsten or other materials). Reactive sputtering of materials like TiN and TaN can be accomplished by using a Ti or Ta target and including gaseous nitrogen in the plasma. In such a case, the nitrogen is introduced into the chamber 400 from a nitrogen gas source which is not shown in FIG. 4. Other combinations of metal targets and reactive gases may be employed.

The target 402 includes an annularly shaped downwardly facing vault 406 facing a substrate 408 which is to be sputter coated. The vault could alternatively be characterized as an annular roof. The vault 406 has an aspect ratio of its depth to radial width of at least 1:2 and preferably at least 1:1. The vault 406 has an outer sidewall 422 outside of the periphery of the substrate 408, an inner sidewall 424 overlying the substrate 408, and a generally flat vault top wall or roof 426 (which forms the bottom of the downwardly facing vault 406). The target 402 includes a central portion forming a post 427 including the inner sidewall 424 and a generally planar face 428 in parallel opposition to the substrate 408. A cylindrical central well 436 of the target 402 is formed between opposed portions of the inner target sidewall 424. The target 402 also includes a flange 438 that is vacuum sealed to a grounded chamber body 450 of the chamber 400 through a dielectric target isolator 452.

The substrate 408 is clamped to a heater pedestal electrode 454 by, for example, a clamp ring 456 although electrostatic chucking may alternatively be employed. An electrically grounded shield 458 acts as an anode with respect to the cathode target 402, which is negatively energized by a power supply 460. As an alternative to DC sputtering, RF sputtering can also be employed, and may be particularly useful for sputtering non-metallic targets.

An electrically floating shield 462 is supported on the electrically grounded shield 458 or chamber body 450 by a dielectric shield isolator 464. A cylindrical knob 466 extending downwardly from the outer target sidewall 422 and positioned inwardly of the uppermost part of the floating shield 462 protects the upper portion of the floating shield 462 and the target isolator 452 from sputter deposition from the strong plasma disposed within the target vault 406. The gap between the upper portion of the floating shield 462 and the target knob 466 and the flange 438 is small enough to act as a dark space (preventing a plasma from propagating into the gap).

A working gas such as argon is supplied into the chamber 400 from a gas source 468 through a mass flow controller 470.

A vacuum pumping system 472 maintains the chamber at a reduced pressure, typically a base pressure of about $10^{-8}$ Torr. An RF power supply 474 RF biases the pedestal electrode 454 through an isolation capacitor (not shown), to produce a negative DC self-bias. Alternatively, the RF power supply may be omitted and the pedestal electrode 454 may be allowed to float to develop a negative self-bias. A controller 476 regulates the power supplies 460, 474, mass flow controller 470, and vacuum system 472 (e.g., according to a sputtering recipe stored in the controller 476). The controller 476 also may control the position and/or temperature of the pedestal electrode 454. The controller 476 may be implemented as the controller 140 of the system 100 of FIG. 1 or as a separate controller (which may or may not communicate with the controller 140).

The magnetron 404 includes inner and outer top magnets 478, 480 overlying the vault roof 426. Side magnets 482, 484 disposed outside of the vault sidewalls 422, 424 have opposed vertical magnetic polarities but are largely decoupled from the top magnets 478, 480 because they are supported on a magnetic yoke 485 by non-magnetic supports 486, 488. As a result, the side magnets 482, 484 create a magnetic field B in the vault 406 that has two generally anti-parallel components extending radially across the vault 406 as well as two components extending generally parallel to the vault sidewalls 422, 424. Thus the magnetic field B extends over a substantial depth of the vault 406 and repels electrons from the sidewalls 422, 424. A magnetic field B' is formed by top magnets 478, 480.

A motor 490 is supported on the chamber body 450 by means of a cylindrical sidewall 492 and a roof 494, which are preferably electrically isolated from the biased target flange 438. The motor 490 has a motor shaft connected to the yoke 485 at a central axis C of the target 402. The motor 490 may rotate the magnetron 404 about the axis C at a suitable rate (e.g., a few hundred rpm). The yoke 485 is asymmetric and may be shaped as a sector. Mechanical counterbalancing may be provided to reduce vibration in the rotation of the axially offset magnetron 404.

Some or all of the magnets of the magnetron 404 may be replaced by stationary ring magnets.

The pressure level employed during sputtering in the chamber 400 of FIG. 4 may be similar to the pressure level employed during sputtering in the chamber 300 of FIG. 3A. The chamber 400 of FIG. 4 produces ionized metal densities in the range of $10^{10}$-$10^{11}$ metal ions/cm$^3$ (e.g., in a bulk region of the plasma) without requiring a coil and over a larger volume than in the chamber 300 of FIG. 3A. Target power may be in the range of about 20-40 kW, although other power ranges may be employed.

A chamber of the type shown in FIG. 4 is disclosed in U.S. Pat. No. 6,277,249 and is available from Applied Materials, Inc., under the name SIP+™. U.S. Pat. No. 6,277,249 is hereby incorporated by reference herein in its entirety. U.S. Pat. No. 6,251,242 is related to U.S. Pat. No. 6,277,249 and is also incorporated by reference herein in its entirety.

Any other high density plasma physical vapor deposition chamber may be similarly employed with embodiments of the present invention.

First Exemplary Inventive Process for Forming a Barrier Layer in a Via

Figure 5:
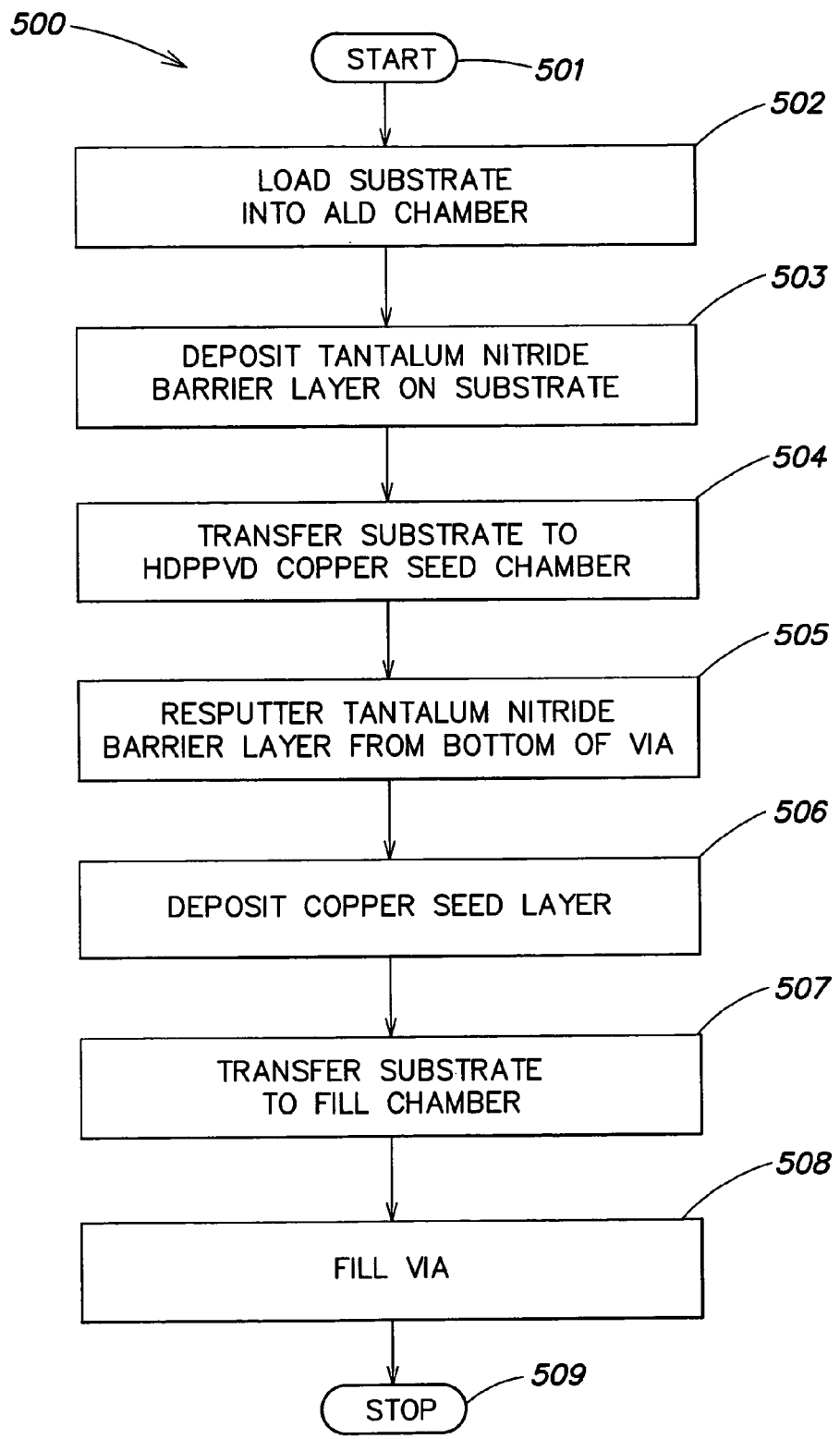
FIG. 5 is a flow chart of a first exemplary process for forming a barrier layer in a via in accordance with the present invention.

FIG. 5 is a flow chart of a first exemplary process 500 for forming a barrier layer in a via. FIGS. 6A-6E are cross-sectional views illustrating the formation of an exemplary interconnect formed in accordance with the process 500.

The process 500 may be performed, for example, with the processing system 100 using the ALD chamber 200 of FIG. 2 and one of the HDPPVD chambers 300, 300', 300", 400 of FIGS. 3A-4; and for convenience will be described with reference thereto. For example, processing chamber 132 of FIG. 1 may be a processing chamber such as the ALD chamber 200 of FIG. 2 configured for atomic layer deposition of a barrier layer. The processing chamber 134 of FIG. 1 may be a processing chamber such as one of the HDPPVD chambers 300, 300', 300", 400 of FIGS. 3A-4 configured for seed layer deposition. Processing chambers 136 and 138 need not be employed. Other processing system configurations and/or processing chamber layouts may be employed.

Figure 6A:
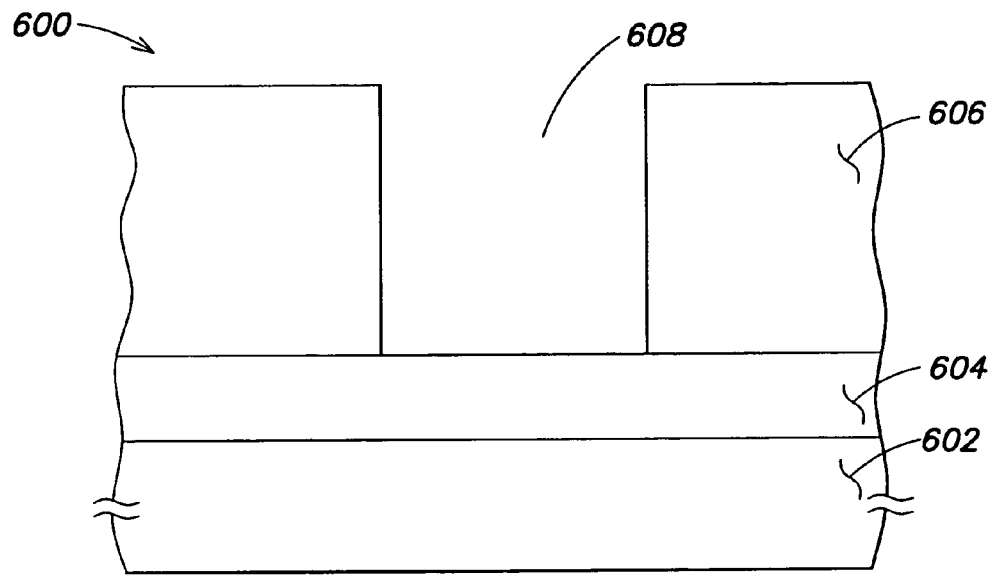
FIGS. 6A-6E are cross-sectional views illustrating the formation of an exemplary interconnect formed in accordance with the process of FIG. 5.
Figure 6B:
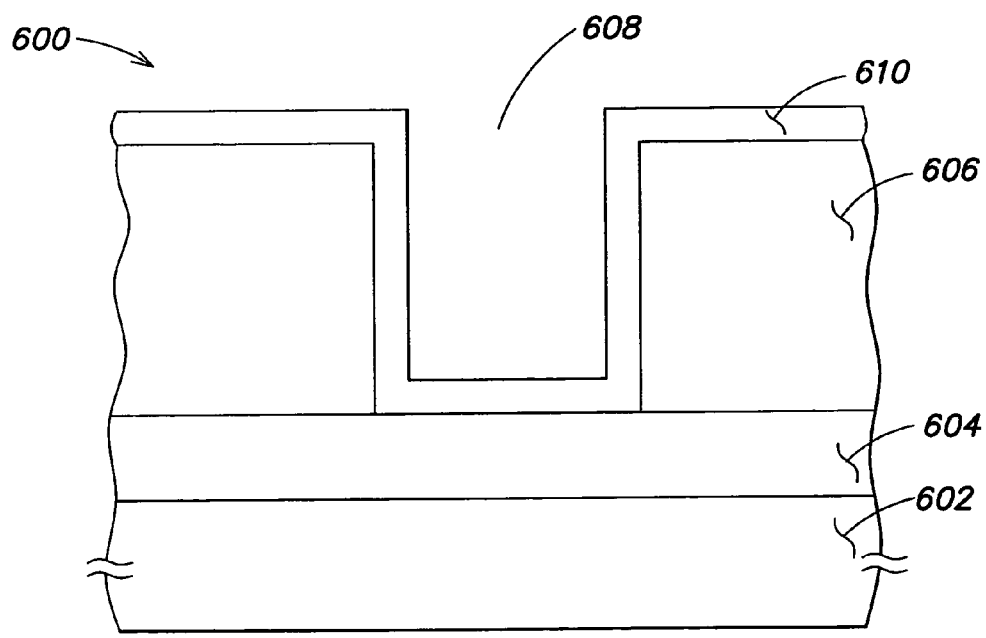

With reference to FIG. 5, the process 500 begins with step 501. In step 502, a substrate 600 (FIG. 6A) is loaded into the processing chamber 132/ALD chamber 200 (e.g., via the second robot 130 (FIG. 1) of the second transfer chamber 126). As shown in FIG. 6A, the substrate 600 includes a bulk region 602, a metal feature 604 formed over the bulk region 602 and a dielectric layer 606 formed over the metal feature 604. A via 608 extends through the dielectric layer 606 to expose the metal feature 604. For convenience, the via 608 is shown as a single damascene feature. It will be understood that more complicated features, such as dual or triple damascene features, similarly may be employed.

The bulk region 602 may comprise, for example, a silicon or other semiconductor region with or without device features (e.g., sources, drains, channels, p-n or n-p junctions, etc.) formed therein. The metal feature 604 may comprise a metal or otherwise conductive feature such as a line, contact, etc., formed from any suitable material such as aluminum, copper or the like. The dielectric layer 606 may comprise silicon dioxide, a low K material such as fluorinated silicon glass or oxide (FSG), carbon doped oxide (e.g., SiOC), polymer spin on (e.g., a spin on glass), etc., or any other suitable dielectric material.

Referring again to FIG. 5, following step 502 is step 503. In step 503, a conformal barrier layer 610 (FIG. 6B) such as a tantalum nitride layer is deposited on the substrate 600 by atomic layer deposition so as to coat the bottom and sidewalls of the via 608. In at least one embodiment of the invention, the barrier layer 610 is deposited with sufficient thickness to serve as a diffusion barrier to metal atoms of the underlying metal feature 604 and/or of the seed layer to be deposited over the barrier layer 610 (as described below).

As an example, if the barrier layer 610 comprises tantalum nitride, the thickness of the barrier layer preferably is in the range of about 15 to 100 angstroms, although a range of about 50-60 angstroms may be more preferred. Such thickness ranges are particularly well suited for via widths of less than about 0.095 microns, or even less than about 0.065 microns, and/or within vias having aspect ratios of 4:1 or greater. An ALD tantalum nitride barrier layer may be deposited, for example, employing a pressure range of about 1-5 Torr, a substrate temperature of about 250-300° C. and tantalum-carrier and ammonia flow rates of about 50-200 sccm and 1000-3000 sccm, respectively, for the appropriate number of cycles (as previously described). Other processing conditions may be employed. Other barrier layers similarly may be deposited.

Following step 503, in step 504 the substrate 600 is transferred from the processing chamber 132/ALD chamber 200 to an HDPPVD seed chamber (e.g., the processing chamber 134 which may be, for example, one of the HDPPVD chambers 300, 300', 300" or 400 configured for seed layer deposition through appropriate target material selection). For convenience, it will be assumed that the HDPPVD chamber 300' of FIG. 3B (e.g., an EnCoRe chamber available from Applied Materials, Inc.) is employed, although any other suitable HDPPVD chamber may be used. The substrate 600 is placed on the support pedestal 318.

In step 505, the portion of the barrier layer 610 that coats the bottom of the via 608 is sputter etched (or "re-sputtered") within the HDPPVD chamber so as to thin or completely remove the barrier layer 610 from the bottom of the via 608. Assuming the HDPPVD chamber 300' of FIG. 3B is employed, sputter etching may be performed, for example, by flowing an inert gas such as argon into the chamber 300' via the gas supply 323. Once pressure within the chamber 300' stabilizes, typically at about 0.5-30 milliTorr although other ranges may be employed, the target 314, the pedestal 318 and the coil 338 are suitably biased to generate a plasma within the chamber 300'. For example, a power signal may be applied to the coil 338 via the RF power supply 340, little or no power may be applied to the target 314 via the DC power supply 322; and a negative bias may be applied to the pedestal 318 (e.g., via the RF power supply 332). The RF power signal applied to the coil 338 causes argon atoms within the chamber 300' to ionize and form a plasma. By adjusting the duty cycle and/or magnitude of the RF power signal applied to the pedestal 318, a negative bias may be created between the pedestal 318 and the plasma. The negative bias between the pedestal 318 and the plasma causes argon ions to accelerate toward the pedestal 318 and the substrate 600 supported thereon. Accordingly, the substrate 600 is sputter-etched by the argon ions.

Under the influence of the negative bias applied to the pedestal 318, the argon ions strike the substrate 600 substantially perpendicularly. Further, the high ion density of the HDPPVD chamber 300', typically greater than $10^{10}$, $10^{11}$ or $10^{12}$ ions/cm$^3$, increases the anisotropic nature of the sputter etch process. Such a high degree of anisotropy is especially beneficial, and in some cases essential, for narrow width, high aspect ratio features, as it allows removal of barrier layers from the bottom of narrow and deep vias (e.g., vias having aspect ratios of about 4:1 or greater and/or via widths of about 0.095 microns or less).

Figure 6C:
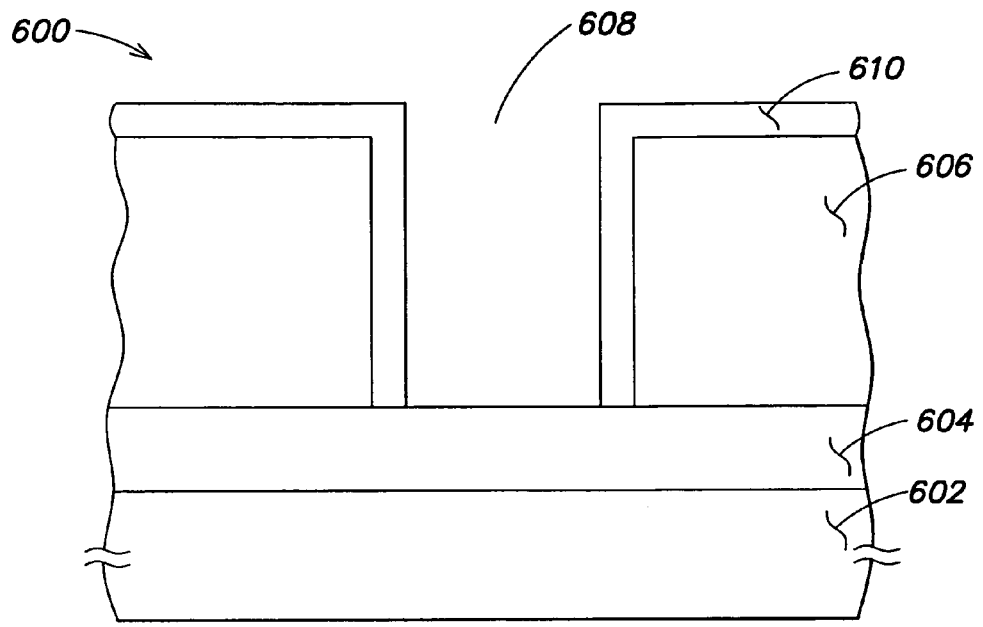
Figure 6D:
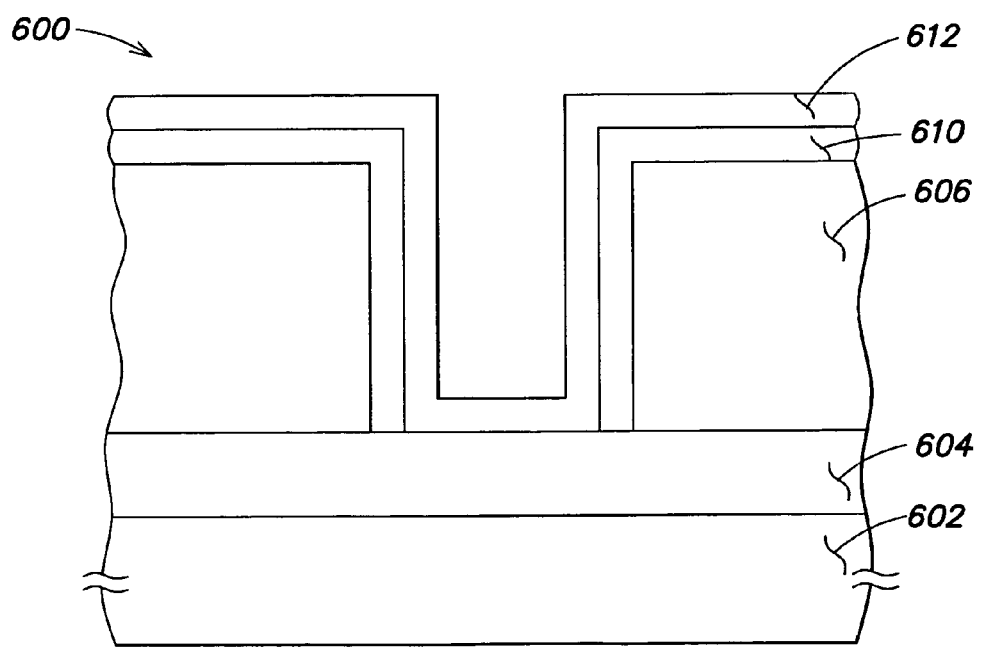

Because little or no power is applied to the target 314 (e.g., 0 to about 500 Watts), little or no material is sputtered from the target 314 and deposits on the substrate 600 during sputter etching. The portion of the barrier layer 610 formed on the bottom of the via 608 thereby may be thinned or removed as shown in FIG. 6C. Note that the barrier layer 610 will be similarly etched from other horizontal regions of the substrate 600 (e.g., field regions, although for clarity the barrier layer 610 is not shown as being removed from these regions in FIGS. 6C and 6D).

In at least one embodiment of the invention, sputter etching is performed within the chamber 300' by employing a chamber pressure of about 0.5-30 milliTorr, a pedestal bias of about 400-1000 Watts at about 13.56 MHz, a coil power of about 1-5 kWatts at about 2 MHz, a target power of less than about 500 Watts and a target/substrate spacing of about 400 mm. Other processing parameters similarly may be employed, as may other HDPPVD chambers such as the chambers 300, 300" and 400 of FIGS. 3A, 3C and 4.

Referring again to FIG. 5, following step 505, a seed layer 612 (FIG. 6D) is deposited over the substrate 600 within the processing chamber 134/HDPPVD chamber 300' (step 506). The seed layer may comprise copper, a copper alloy, ruthenium, a ruthenium alloy or any other suitable seed layer material. In at least one embodiment, the seed layer comprises about 1000-1500 angstroms of copper, although other thicknesses may be employed. Such a seed layer may be deposited, for example, by employing a chamber pressure of about 0.5-30 milliTorr, a pedestal bias of about 250 Watts or less at about 13.56 MHz, a coil power of about 1-5 kWatts at about 2 MHz, a target power of about 500 Watts to 5 kWatts and a target/substrate spacing of about 400 mm. Other processing parameters similarly may be employed.

While steps 505 and 506 have been shown as occurring sequentially, it will be understood that through appropriate manipulation of target power, coil power and/or pedestal bias (e.g., pedestal power and/or duty cycle), the barrier layer 610 may be removed from the bottom of the via 608 at the same time or during at least a portion of the time that the seed layer 612 is deposited within the via 608. For example, simultaneous deposition of a copper seed layer and removal of a tantalum nitride barrier layer may be performed in the chamber 300' by employing a chamber pressure of about 0.5-30 milliTorr, a pedestal bias of about 400-1000 Watts at about 13.56 MHz, a coil power of about 1-5 kWatts at about 2 MHz, a target power of about 500 Watts to 5 kWatts and a target/substrate spacing of about 400 mm. Other processing parameters similarly may be employed.

Figure 6E:
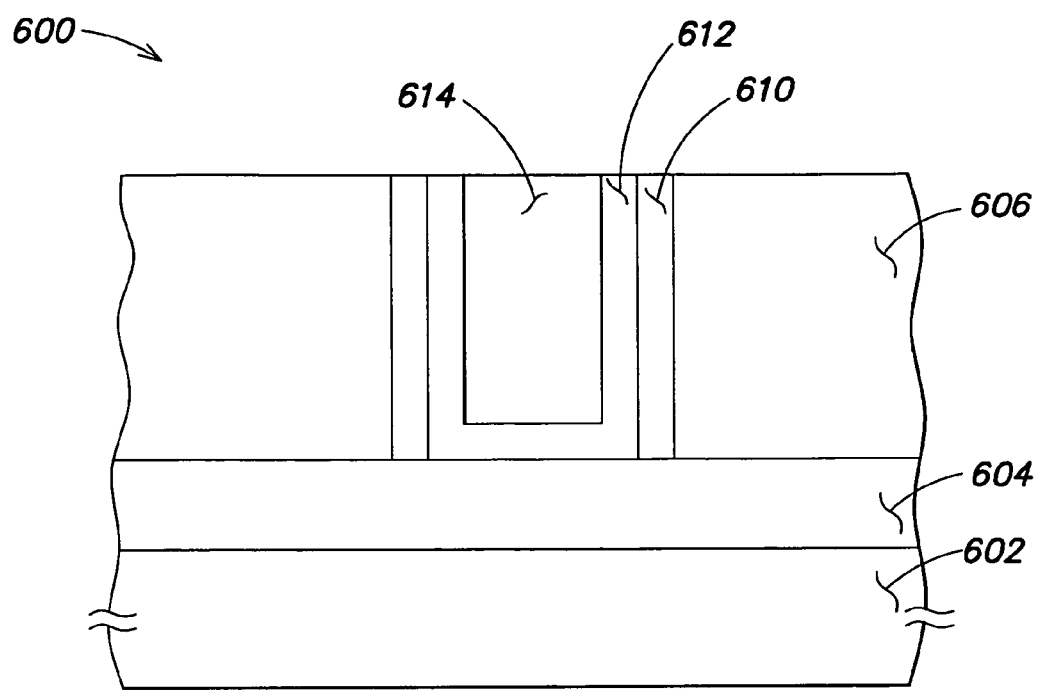

After the seed layer 612 has been deposited within the via 608, in step 507 the substrate 600 may be transferred to a fill chamber and in step 508 the via 608 may be filled. The substrate 600 then may be planarized as shown in FIG. 6E. For example, the substrate 600 may be transferred to a fill chamber, such as an electro-chemical plating (ECP) chamber, and filled (e.g., with copper or another suitable material, referred to by reference numeral 614 in FIG. 6E). Thereafter, the substrate 600 may be transferred to a planarization tool and planarized, such as via chemical-mechanical polishing. Separate transfer and/or planarization steps are not shown in FIG. 5. Following step 508, the process 500 ends at step 509.

Via filling may be performed, for example, in an electro-chemical plating tool such as the Electra™ Cu ECP system, available from Applied Materials, Inc. The Electra™ Cu ECP system may be integrated into an Endura™ platform also available from Applied Materials, Inc. (e.g., a processing system such as the processing system 100 of FIG. 1). Chemical mechanical polishing (CMP) may be performed, for example, in a Mirra™ System available from Applied Materials.

By performing sputter etching (e.g., resputtering) with the seed chamber, the need for a separate sputtering chamber is eliminated and system throughput is increased. The use of only ALD barrier layers also improves overall barrier layer uniformity, and decreases deposition on field regions of the substrate. Post metallization process times, such as chemical mechanical polishing times, thereby may be reduced.

Second Exemplary Inventive Process for Forming a Barrier Layer in a Via

Figure 7:
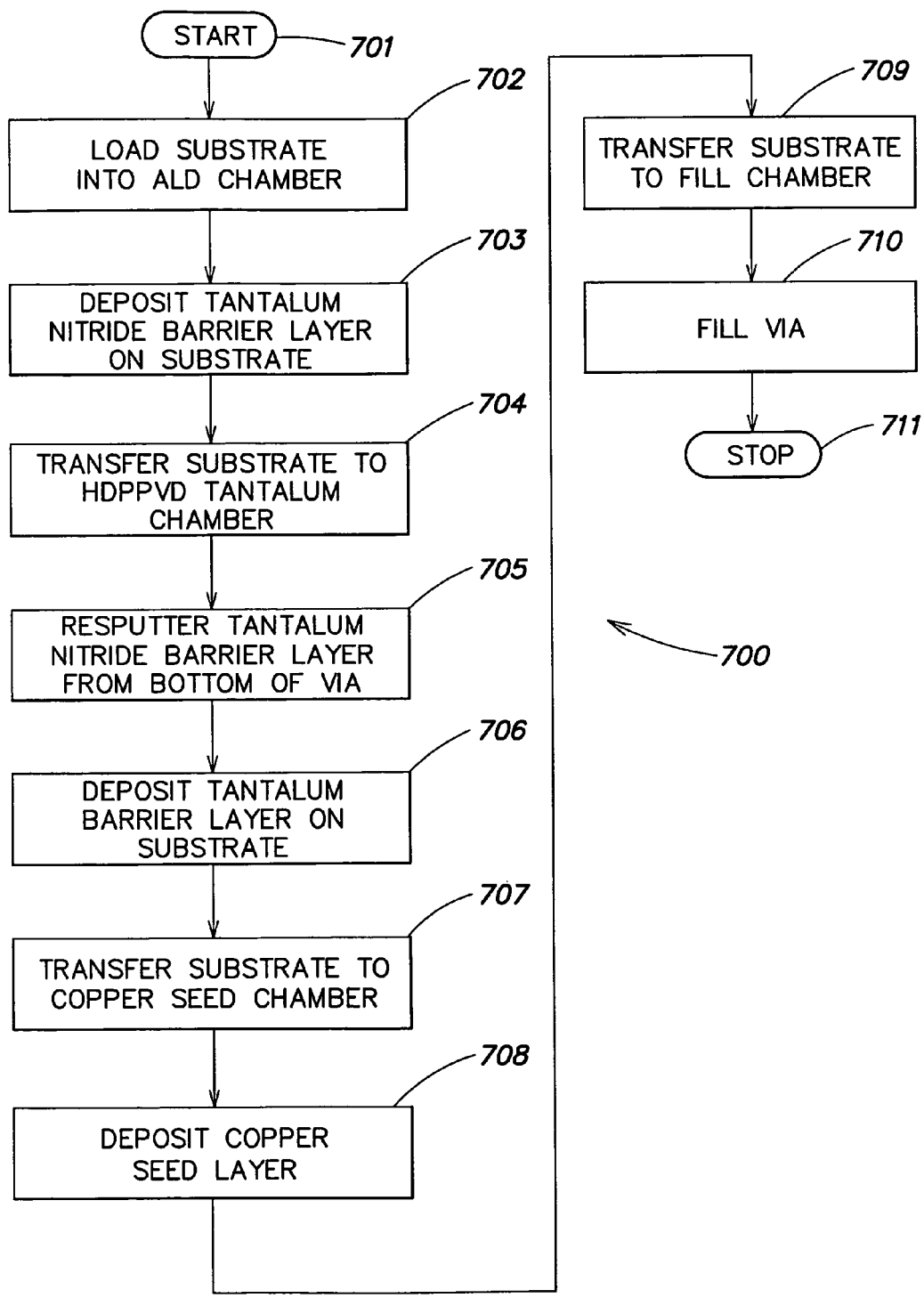
FIG. 7 is a flow chart of a second exemplary process for forming a barrier layer in a via in accordance with the present invention.

FIG. 7 is a flow chart of a second exemplary process 700 for forming a barrier layer in a via. FIGS. 8A-8F are cross-sectional views illustrating the formation of an exemplary interconnect formed in accordance with the process 700.

The process 700 may be performed, for example, with the processing system 100 of FIG. 1 using (1) the ALD chamber 200 of FIG. 2; (2) one of the HDPPVD chambers 300, 300', 300", 400 of FIGS. 3A-4 configured for barrier layer deposition; and (3) a seed layer deposition chamber (which may or may not be one of the HDPPVD chambers 300, 300', 300", 400); For convenience, the process 700 will be described with reference to the processing system 100. For example, the processing chamber 132 of FIG. 1 may be a processing chamber such as the ALD chamber 200 of FIG. 2 configured for atomic layer deposition of a barrier layer. The processing chamber 134 of FIG. 1 may be a processing chamber such as one of the HDPPVD chambers 300, 300', 300", 400 configured for barrier layer deposition. The processing chamber 136 of FIG. 1 may be a seed layer deposition chamber. Processing chamber 138 need not be employed. Other processing system configurations and/or processing chamber layouts may be used.

Figure 8A:
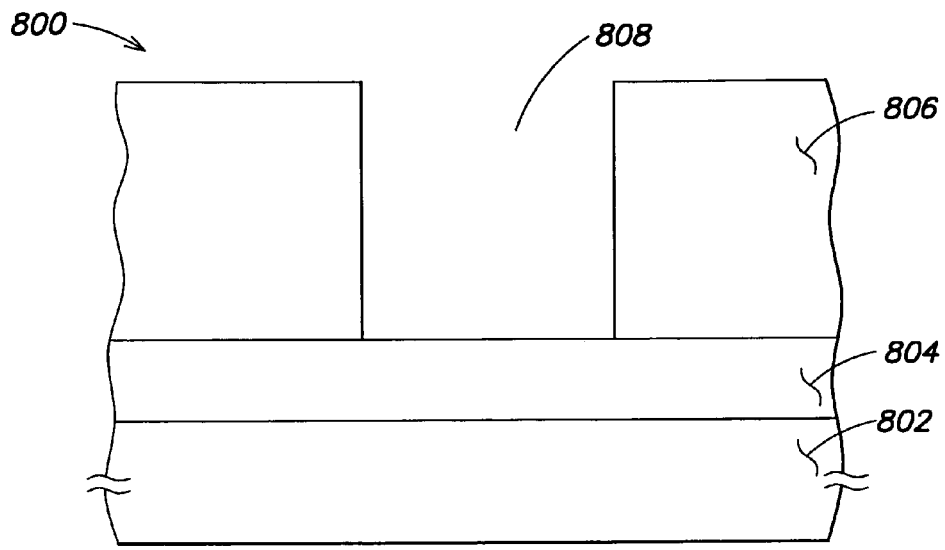
FIGS. 8A-8F are cross-sectional views illustrating the formation of an exemplary interconnect formed in accordance with the process of FIG. 7.
Figure 8B:
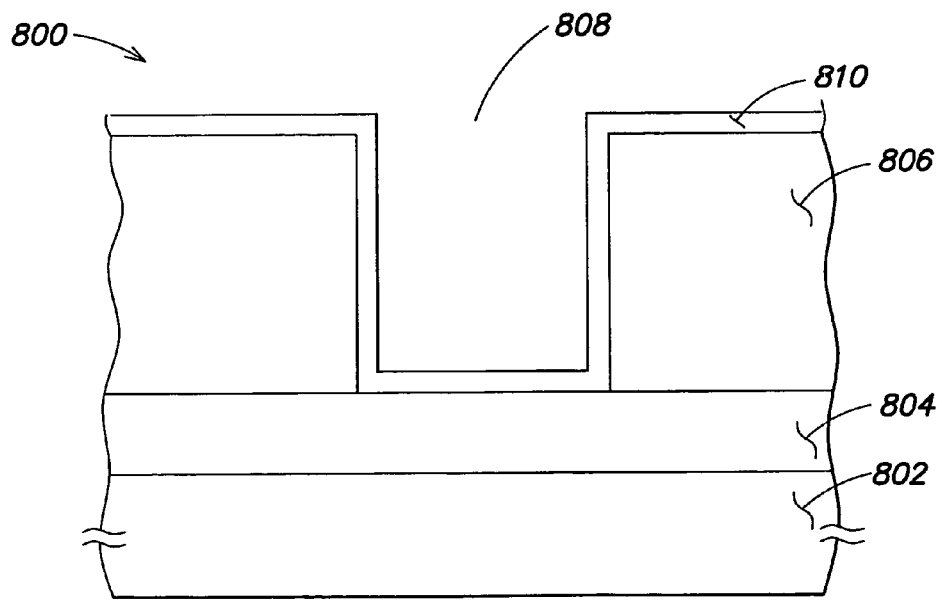

With reference to FIG. 7, the process 700 begins with step 701. In step 702, a substrate 800 (FIG. 8A) is loaded into the processing chamber 132/ALD chamber 200 (e.g., via the second robot 130 (FIG. 1) of the second transfer chamber 126). As shown in FIG. 8A, the substrate 800 includes a bulk region 802, a metal feature 804 formed over the bulk region 802 and a dielectric layer 806 formed over the metal feature 804. A via 808 extends through the dielectric layer 806 to expose the metal feature 804. For convenience, the via 808 is shown as a single damascene feature. It will be understood that more complicated features, such as dual or triple damascene features, similarly may be employed.

The bulk region 802 may comprise, for example, a silicon or other semiconductor region with or without device features (e.g., sources, drains, channels, p-n or n-p junctions, etc.) formed therein. The metal feature 804 may comprise a metal or otherwise conductive feature such as a line, contact, etc., formed from any suitable material such as aluminum, copper or the like. The dielectric layer 806 may comprise silicon dioxide, a low K material such as fluorinated silicon glass or oxide (FSG), carbon doped oxide (e.g., SiOC), polymer spin on (e.g., a spin on glass), etc., or any other suitable dielectric material.

Referring again to FIG. 7, following step 702 is step 703. In step 703, a conformal, first barrier layer 810 (FIG. 7B) such as a tantalum nitride layer is deposited on the substrate 800 by atomic layer deposition so as to coat the bottom and sidewalls of the via 808. The first barrier layer 810 may or may not be deposited with sufficient thickness to serve as a diffusion barrier to metal atoms of the underlying metal feature 804 and/or of the seed layer to be deposited within the via 808 (as described below). In at least one embodiment, wherein the dielectric layer 806 comprises a low K dielectric material, the first barrier layer 810 preferably is deposited with sufficient thickness to provide mechanical stability to the low K dielectric during subsequent processing (e.g., enhanced low K dielectric stress migration and electro-migration performance).

As an example, if the first barrier layer 810 comprises tantalum nitride, the thickness of the barrier layer preferably is in the range of about 5 to 50 angstroms, although a range of about 10-20 angstroms may be more preferred. Such thickness ranges are particularly well suited for via widths of less than about 0.2 microns, or even 0.15 or 0.1 microns or below, and/or within vias having aspect ratios of 4:1 or greater. Such an ALD tantalum nitride barrier layer may be deposited, for example, as previously described with reference to FIGS. 2 and/or 5. Other barrier layers similarly may be deposited.

Following step 703 is step 704 wherein the substrate 800 is transferred from the processing chamber 132/ALD chamber 200 to an HDPPVD barrier layer chamber (e.g., the processing chamber 134 which may be, for example, one of the HDPPVD chambers 300, 300', 300" or 400 configured for deposing a second barrier layer through appropriate target material selection). For convenience, it will be assumed that the HDPPVD chamber 300' of FIG. 3B (e.g., an EnCoRe chamber available from Applied Materials, Inc.) is employed, although any other suitable HDPPVD chamber may be used. The substrate 800 is placed on the support pedestal 318.

In step 705, the portion of the first barrier layer 810 that coats the bottom of the via 808 is sputter etched (or "resputtered") within the HDPPVD chamber 300 so as to thin or completely remove the first barrier layer from the bottom of the via 808. Sputter etching may be performed, for example, through appropriate manipulation of target power, coil power and pedestal bias as previously described with reference to the process 500 of FIG. 5, using similar processing conditions.

For example, assuming the HDPPVD chamber 300' of FIG. 3B is employed, resputtering may be performed by flowing an inert gas such as argon into the chamber 300' via the gas supply 323. Once pressure within the chamber 300' stabilizes, typically at about 0.5-30 milliTorr although other ranges may be employed, the target 314, the pedestal 318 and the coil 338 are suitably biased to generate a plasma within the chamber 300'. For example, a power signal may be applied to the coil 338 via the RF power supply 340, little or no power may be applied to the target 314 via the DC power supply 322; and a negative bias may be applied to the pedestal 318 (e.g., via the RF power supply 332). The RF power signal applied to coil 338 causes argon atoms within the chamber 300' to ionize and form a plasma. By adjusting the duty cycle and/or magnitude of the RF power signal applied to the pedestal 318, a negative bias may be created between the pedestal 318 and the plasma. The negative bias between the pedestal 318 and the plasma causes argon ions to accelerate toward the pedestal 318 and the substrate 800 supported thereon. Accordingly, the substrate 800 is sputter-etched by the argon ions.

Under the influence of the negative bias applied to the pedestal 318, the argon ions strike the substrate 800 substantially perpendicularly. Further, the high ion density of the HDPPVD chamber 300', typically greater than $10^{10}$, $10^{11}$ or $10^{12}$ ions/cm$^3$, increases the anisotropic nature of the sputter etch process. As previously described, such a high degree of anisotropy is especially beneficial, and in some cases essential, for narrow width, high aspect ratio features, as it allows removal of barrier layers from the bottom of narrow and deep vias.

Figure 8C:
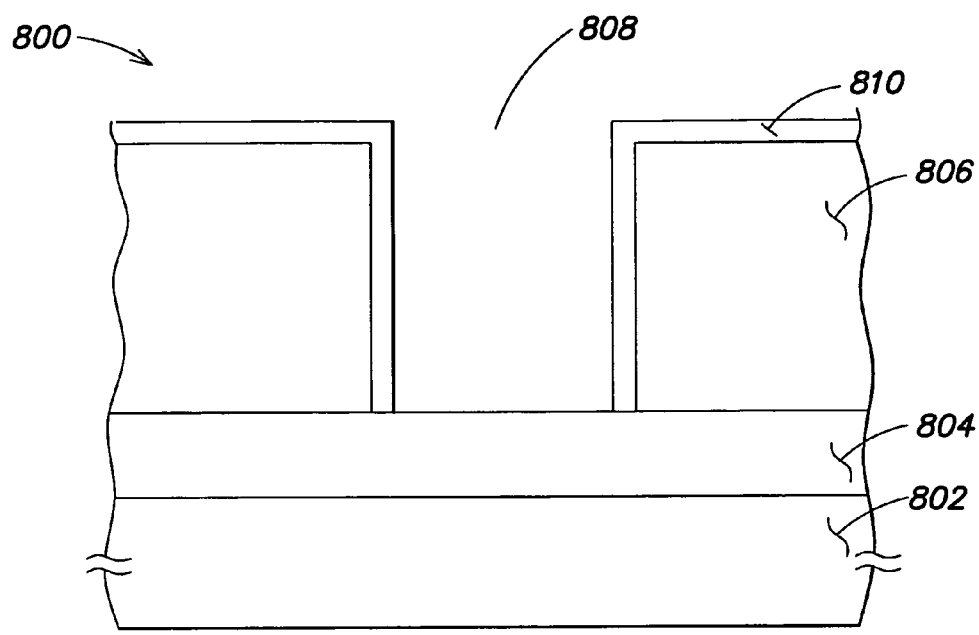
Figure 8D:
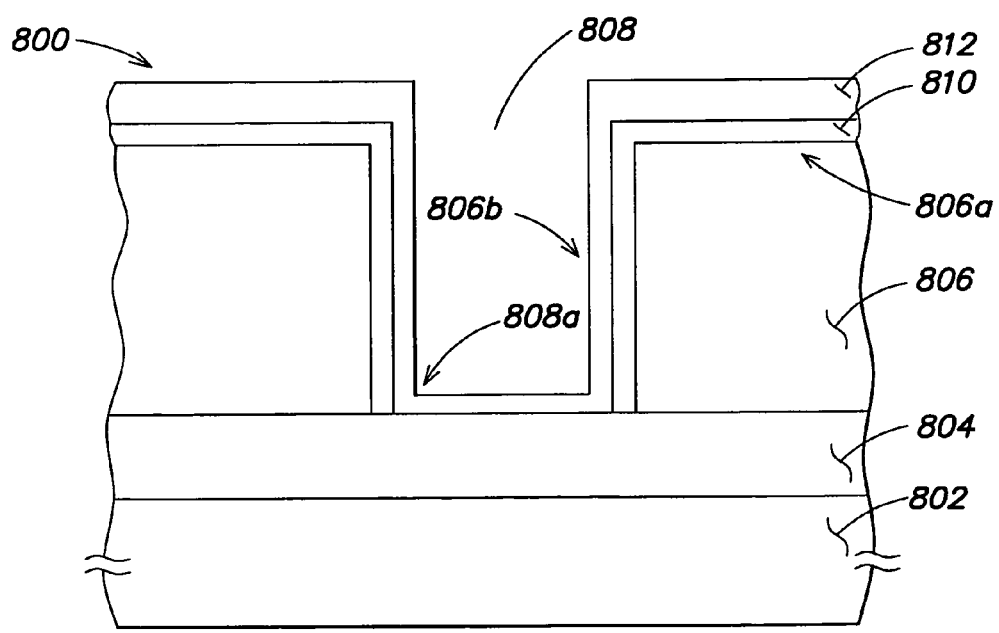
Figure 8E:
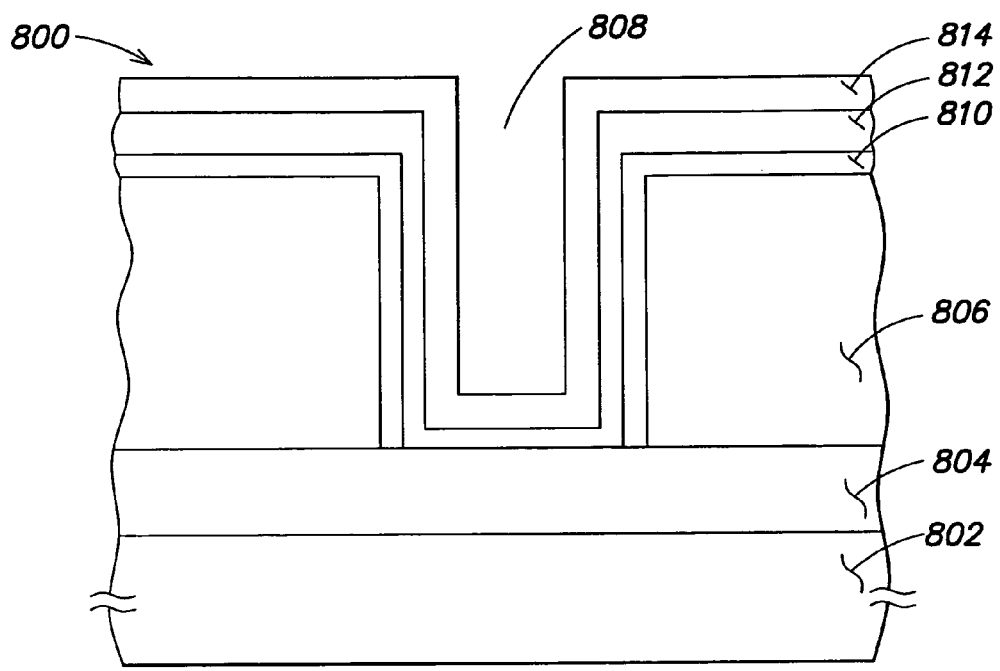

Because little or no power is applied to the target 314 (e.g., 0 to about 500 Watts), little or no material is sputtered from the target 314 and deposits on the substrate 800 during sputter etching. The portion of the first barrier layer 810 formed on the bottom of the via 808 thereby may be thinned or removed as shown in FIG. 8C. Note that the barrier layer 810 will be similarly etched from other horizontal regions of the substrate 800 (e.g., field regions, although for clarity the barrier layer 810 is not shown as being removed from these regions in FIGS. 8C-8E).

Referring again to FIG. 7, following step 705, a second barrier layer 812 (FIG. 8D) is deposited over the substrate 800 within the processing chamber 134/HDPPVD chamber 300' (step 706). The second barrier layer 812 may comprise any suitable barrier layer such as tantalum, titanium, tungsten, nitrides thereof, etc. In at least one embodiment wherein the first barrier layer 810 comprises tantalum nitride, the second barrier layer 812 may comprise about 10 to 50 angstroms of tantalum as measured on the sidewalls of the via 808. Because of the directionality of high density plasma physical vapor deposition employing pedestal biasing, only a fraction of the material deposited on the field regions and via bottom of the substrate 800 is deposited on the sidewalls. For example, depending on the aspect ratio and/or via width of the via 808, about 50-60% of the barrier material deposited on a field region of the substrate 800 (e.g., region 806a in FIG. 8D) is deposited on the bottom region of the via 808 (e.g., region 808a in FIG. 8D). Likewise, only about 5% of the barrier material deposited on the field region 806a of the substrate 800 is deposited on the sidewall region of the via 808 (e.g., region 806b in FIG. 8D). A suitable tantalum barrier layer may be deposited, for example, employing the processing parameters discussed previously with reference to FIGS. 3A-3B. Other processing parameters similarly may be employed.

While steps 705 and 706 have been shown as occurring sequentially, it will be understood that through appropriate manipulation of target power, coil power and/or pedestal bias (e.g., pedestal power and/or duty cycle), the first barrier layer 810 may be removed from the bottom of the via 808 at the same time or during at least a portion of the time that the second barrier layer 812 is deposited within the via 808 (e.g., in a manner similar to the seed deposition described with reference to FIG. 5). Other processing parameters may be employed, for example, such as those described in commonly owned U.S. Pat. No. 6,287,977, issued Sep. 11, 2001 and titled "Method and Apparatus for Forming Improved Metal Interconnects", which is hereby incorporated by reference herein in its entirety. Likewise, the second barrier layer 812 may be resputtered from the bottom of the via 808 to thin or remove the bottom barrier layer.

In step 707, the substrate 800 is transferred from the processing chamber 134/HDPPVD chamber 300' to a seed layer deposition chamber (e.g., the processing chamber 136 in FIG. 1 which may or may not be configured in a manner similar to chambers 300, 300', 300", 400 of FIGS. 3A-4). In step 708, a seed layer 814 (FIG. 8E) is deposited on the substrate 808. The seed layer 814 may comprise copper, a copper alloy, ruthenium, a ruthenium alloy or any other suitable seed layer material. In at least one embodiment, the seed layer 814 comprises about 1000-1500 angstroms of copper, although other thicknesses may be employed. Such a seed layer may be deposited, for example, employing the parameters discussed previously with reference to FIG. 5. If desired, the portion of the second barrier layer 812 that coats the bottom region 808a of the via 808 may be thinned and/or removed prior to and/or during seed layer deposition as described previously with reference to FIG. 5.

Figure 8F:
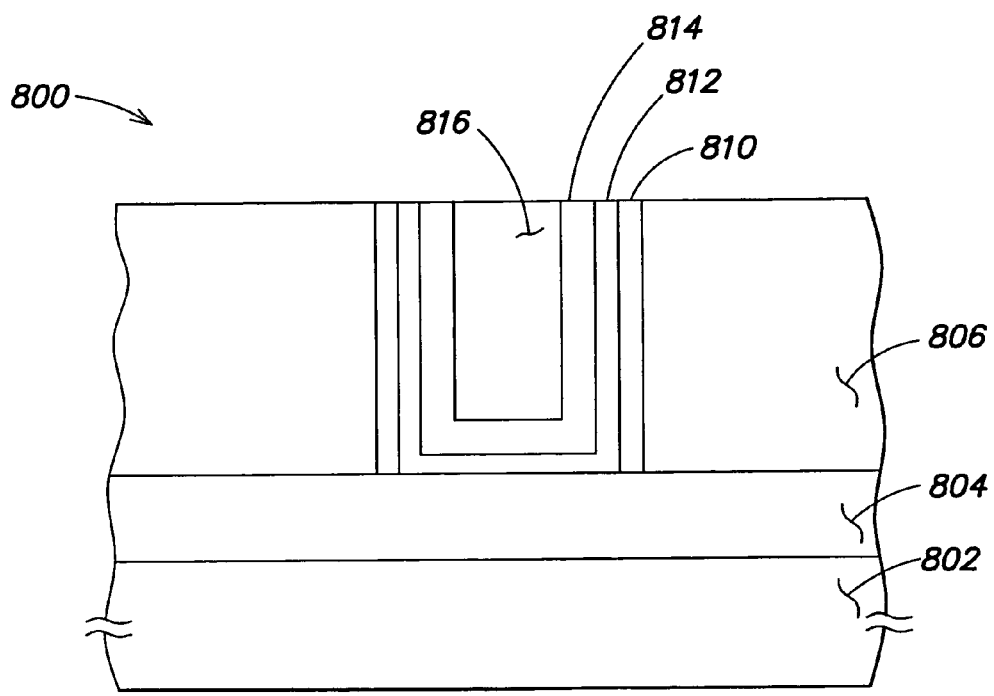

After the seed layer 814 has been deposited within the via 808, in step 709 the substrate 800 may be transferred to a fill chamber and in step 710 the via 808 may be filled. The substrate 800 then may be planarized as shown in FIG. 8F. For example, the substrate 800 may be transferred to a fill chamber, such as an electro-chemical plating (ECP) chamber, and filled (e.g., with copper or another suitable material, referred to by reference numeral 816 in FIG. 8F). Thereafter, the substrate 800 may be planarized (separate step not shown in FIG. 7), such as via chemical-mechanical polishing. Separate transfer and/or planarization steps are not shown in FIG. 7. Following step 710, the process 700 ends at step 711.

By employing atomic layer deposition to deposit the first barrier layer, adequate sidewall coverage may be achieved, even within high aspect ratio vias, to ensure diffusion resistance and mechanical strength (e.g., even when a low K dielectric interlayer is employed). By employing HDPPVD to deposit the second barrier layer following ALD, a thin (or no) bottom barrier layer may be obtained despite the presence of thick sidewall coverage.

Third Exemplary Inventive Process for Forming a Barrier Layer in a Via

Figure 9:
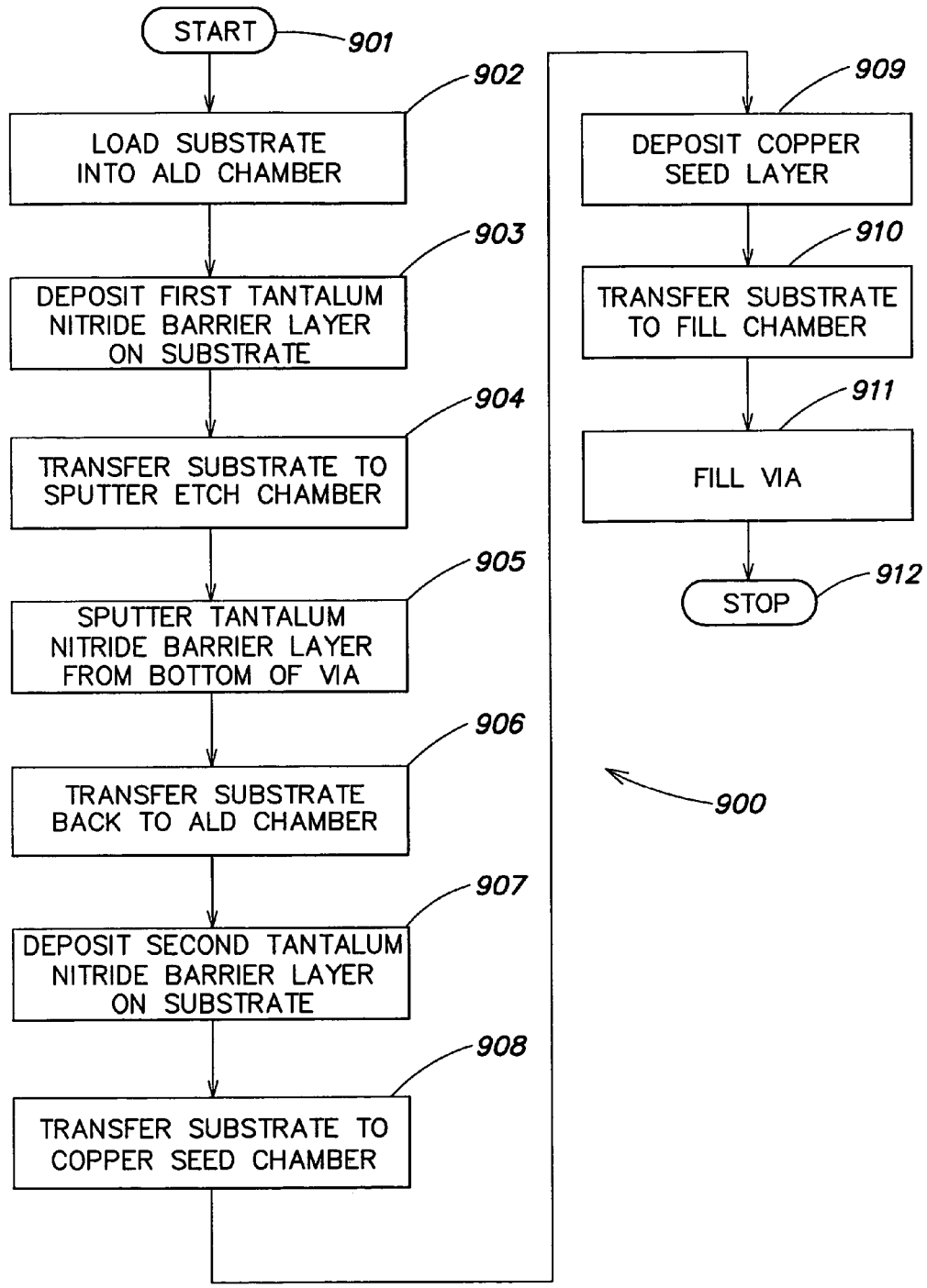
FIG. 9 is a flow chart of a third exemplary process for forming a barrier layer in a via in accordance with the present invention.

FIG. 9 is a flow chart of a third exemplary process 900 for forming a barrier layer in a via. FIGS. 10A-10F are cross-sectional views illustrating the formation of an exemplary interconnect formed in accordance with the process 900.

The process 900 may be performed, for example, with the processing system 100 using (1) the ALD chamber 200 of FIG. 2; (2) a sputter etch chamber (which may or may not be one of the HDPPVD chambers 300, 300', 300", 400 of FIGS. 3A-4); and (3) a seed layer deposition chamber (which may or may not be one of the HDPPVD chambers 300, 300', 300", 400 of FIGS. 3A-4). For convenience, the process 900 will be described with reference to the processing system 100. For example, the processing chamber 132 of FIG. 1 may be a processing chamber such as the ALD chamber 200 of FIG. 2 configured for atomic layer deposition of a barrier layer. The processing chamber 134 of FIG. 1 may be a dedicated sputter etch chamber (such as a pre-clean chamber described below), or one of the HDPPVD chambers 300, 300', 300", 400 of FIGS. 3A-4 configured for barrier layer or seed layer deposition. The processing chamber 136 of FIG. 1 may be a seed layer deposition chamber. Processing chamber 138 need not be employed. Other processing system configurations and/or processing chamber layouts may be used.

With regard to any of the first, second and third embodiments described herein, prior to depositing a barrier layer, a patterned or etched substrate dielectric layer (e.g., having vias formed therein) may be cleaned to remove native oxides or other contaminants from the surfaces thereof. For example, reactive gases may be excited into a plasma within a remote plasma source chamber such as a Reactive Pre-clean™ chamber available from Applied Materials, Inc. and employed to remove such native oxides/contaminants as is known in the art. Likewise, a non-chemical, sputter-only system such as a Pre-clean™ chamber also available from Applied Materials, Inc., may be similarly employed. As used herein, a "sputter etch" chamber may include a Pre-clean™ or Reactive Pre-clean™ chamber or any other chamber capable of sputter etching. In at least one embodiment of the invention, the dedicated sputter etching chamber described above may comprise a Pre-clean™ chamber.

Figure 10A:
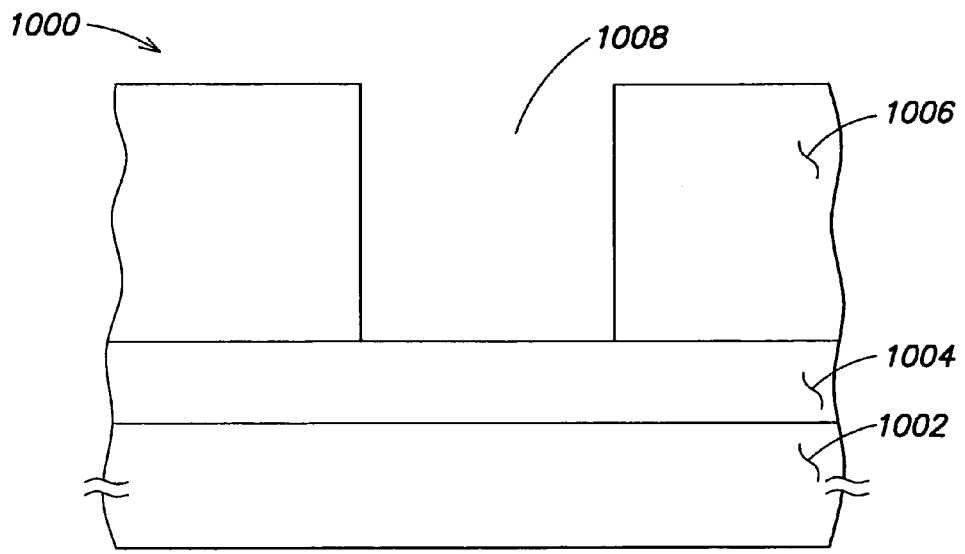
FIGS. 10A-10F are cross-sectional views illustrating the formation of an exemplary interconnect formed in accordance with the process of FIG. 9.
Figure 10B:
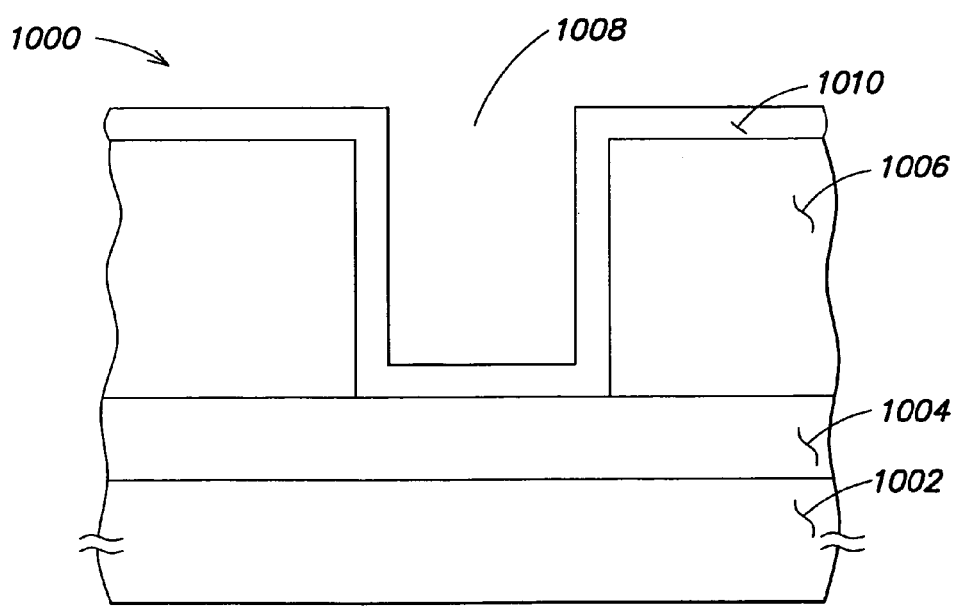
Figure 10C:
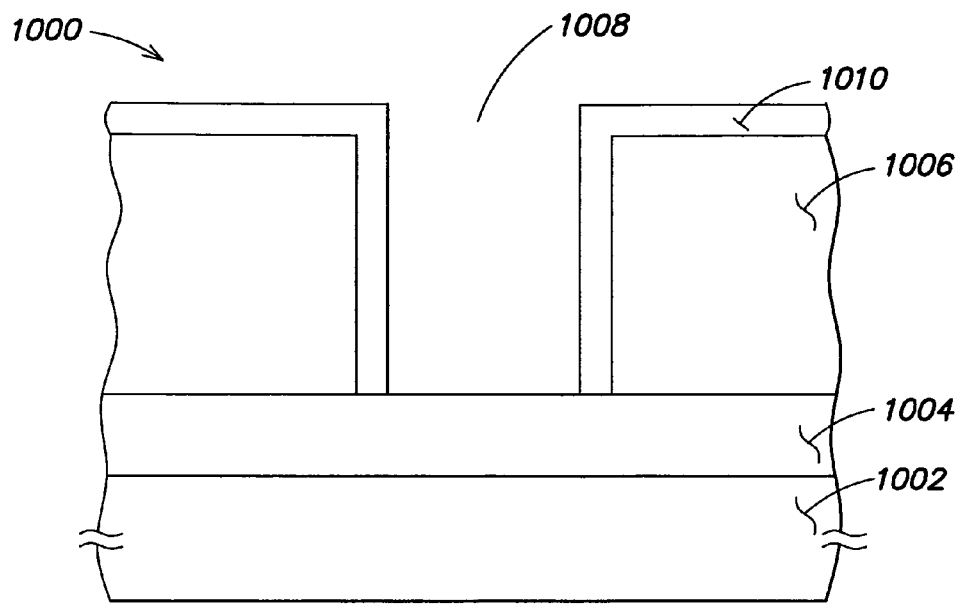
Figure 10D:
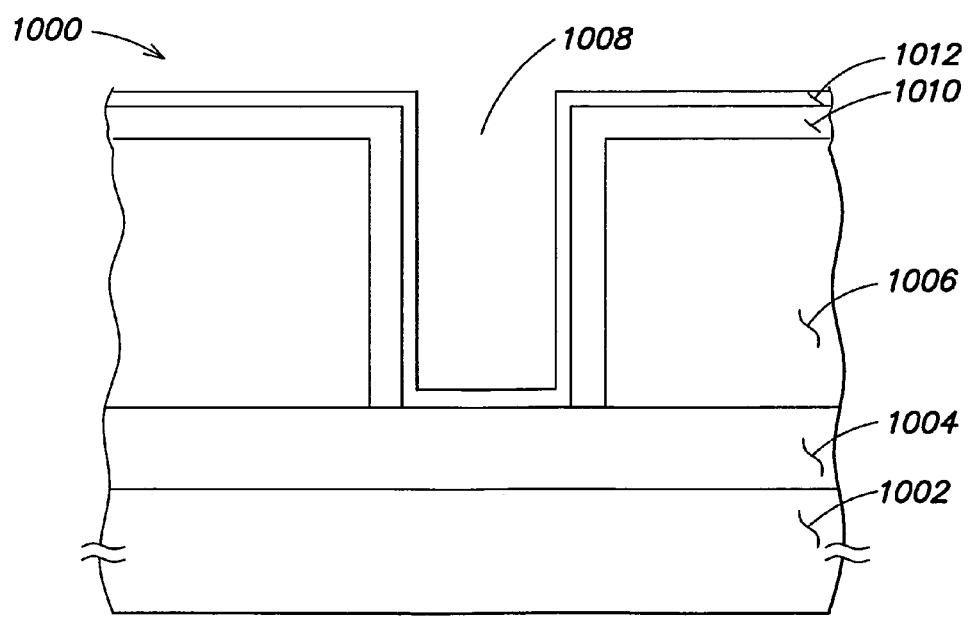
Figure 10E:
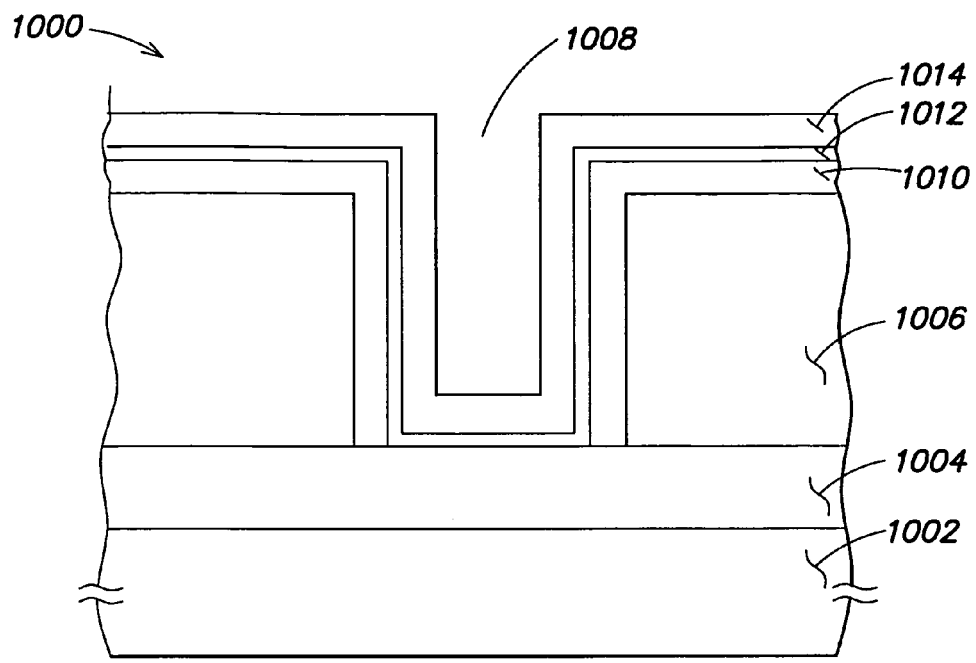

With reference to FIG. 9, the process 900 begins with step 901. In step 902, a substrate 1000 (FIG. 10A) is loaded into the processing chamber 132/ALD chamber 200 (e.g., via the second robot 130 (FIG. 1) of the second transfer chamber 126). As shown in FIG. 10A, the substrate 1000 includes a bulk region 1002, a metal feature 1004 formed over the bulk region 1002 and a dielectric layer 1006 formed over the metal feature 1004. A via 1008 extends through the dielectric layer 1006 to expose the metal feature 1004. For convenience, the via 1008 is shown as a single damascene feature. It will be understood that more complicated features, such as dual or triple damascene features, similarly may be employed.

The bulk region 1002 may comprise, for example, a silicon or other semiconductor region with or without device features (e.g., sources, drains, channels, p-n or n-p junctions, etc.) formed therein. The metal feature 1004 may comprise a metal or otherwise conductive feature such as a line, contact, etc., formed from any suitable material such as aluminum, copper or the like. The dielectric layer 1006 may comprise silicon dioxide, a low K material such as fluorinated silicon glass or oxide (FSG), carbon doped oxide (e.g., SiOC), polymer spin on (e.g., a spin on glass), etc., or any other suitable dielectric material.

Referring again to FIG. 9, following step 902 is step 903. In step 903, a conformal, first barrier layer 1010 (FIG. 9B) such as a tantalum nitride layer is deposited on the substrate 1000 by atomic layer deposition so as to coat the bottom and sidewalls of the via 1008. In at least one embodiment of the invention, the first barrier layer 1010 may (but need not) be deposited with sufficient thickness to serve as a diffusion barrier to metal atoms of the underlying metal feature 1004 and/or of the seed layer to be deposited within the via 1008 (as described below). If the dielectric layer 1006 comprises a low K dielectric material, the first barrier layer 1010 may be deposited with sufficient thickness to provide mechanical stability to the low K dielectric layer during subsequent processing (e.g., enhanced low K dielectric stress migration and electro-migration performance).

As an example, if the first barrier layer 1010 comprises tantalum nitride, the thickness of the first barrier layer 1010 preferably is in the range of about 20 to 100 angstroms, although a range of about 50-65 angstroms may be preferred. Such thickness ranges are particularly well suited for via widths of less than about 0.2 microns, or even 0.15 or 0.1 microns or below, and/or within vias having aspect ratios of 4:1 or greater. Such an ALD tantalum nitride barrier layer may be deposited, for example, as previously described with reference to FIGS. 2 and/or 5. Other barrier layers similarly may be deposited.

Following step 903 is step 904 wherein the substrate 1000 is transferred from the processing chamber 132/ALD chamber 200 to a sputter etch chamber (e.g., the processing chamber 134 which may be, for example, a dedicated sputter etch chamber or an HDPPVD chamber such as one of the HDP-PVD chambers 300, 300', 300" or 400 configured for seed layer deposition). For convenience, the sputter etch chamber will be referred to only as the processing chamber 134 (FIG. 1).

In step 905, the portion of the first barrier layer 1010 that coats the bottom of the via 1008 is sputter etched (or "re-sputtered") within the processing chamber 134 so as to thin or completely remove the first barrier layer 1010 from the bottom of the via 1008. Sputter etching may be performed, for example, by any conventional technique or if one of the HDPPVD chambers 300, 300', 300", 400 is employed through appropriate manipulation of target power, coil power and/or pedestal bias as previously described with reference to the process of FIG. 5. The portion of the first barrier layer 1010 formed on the bottom of the via 1008 is shown as being thinned or removed in FIG. 10C. The barrier layer 1010 may be similarly etched from other horizontal regions of the substrate 1000 (e.g., field regions, although for clarity the barrier layer 1010 is not shown as being removed from these regions in FIGS. 10C-10E). As stated, rather than employing a dedicated sputter etch chamber, the sputter etch step (step 905) may be performed, for example, in an HDPPVD seed chamber as described previously with reference to FIG. 5.

Referring again to FIG. 9, following step 905, the substrate 1000 is transferred back into the processing chamber 132/ ALD chamber 200 (step 906) and a second barrier layer 1012 (FIG. 10D) is deposited over the substrate 1000 by atomic layer deposition in step 907. The second barrier layer 1012 may comprise any suitable barrier layer such as tantalum, titanium, tungsten, nitrides thereof, etc. In at least one embodiment wherein the first barrier layer 1010 comprises tantalum nitride having a thickness range of about 20 to 100 angstroms, the second barrier layer 1012 may comprise about 5 to 20 angstroms of tantalum nitride, and preferably about 10 angstroms. As described in U.S. patent application Ser. No. 10/199,415, filed Jul. 18, 2002 and titled "ENHANCED COPPER GROWTH WITH ULTRATHIN BARRIER LAYER FOR HIGH PERFORMANCE INTERCONNECTS", which is hereby incorporated by reference herein in its entirety, refractory metal nitride barrier layers in this thickness range (below about 20 angstroms) may provide adequate barrier properties while allowing grain growth of a first metal layer to continue across the barrier layer into a second metal layer, thereby enhancing the electrical performance of an interconnect. A suitable tantalum nitride barrier layer may be deposited, for example, employing the processing parameters discussed previously with reference to FIG. 2. Other processing parameters similarly may be employed.

In step 908, the substrate 1000 is transferred from the processing chamber 132/ALD chamber 200 to a seed layer deposition chamber (e.g., processing chamber 136 in FIG. 1 which may or may not be configured in a manner similar to chambers 300, 300', 300", 400 of FIGS. 3A-4). In step 909, a seed layer 1014 (FIG. 10E) is deposited on the substrate 1000. The seed layer 1014 may comprise copper, a copper alloy, ruthenium, a ruthenium alloy or any other suitable seed layer material. In at least one embodiment, the seed layer 1014 comprises about 1000-1500 angstroms of copper, although other thicknesses may be employed. Such a seed layer may be deposited, for example, employing the parameters discussed previously with reference to FIG. 5. If desired, the portion of the second barrier layer 1012 that coats the bottom region of the via 1008 may be thinned and/or removed prior to and/or during seed layer deposition as described previously with reference to FIG. 5.

Figure 10F:
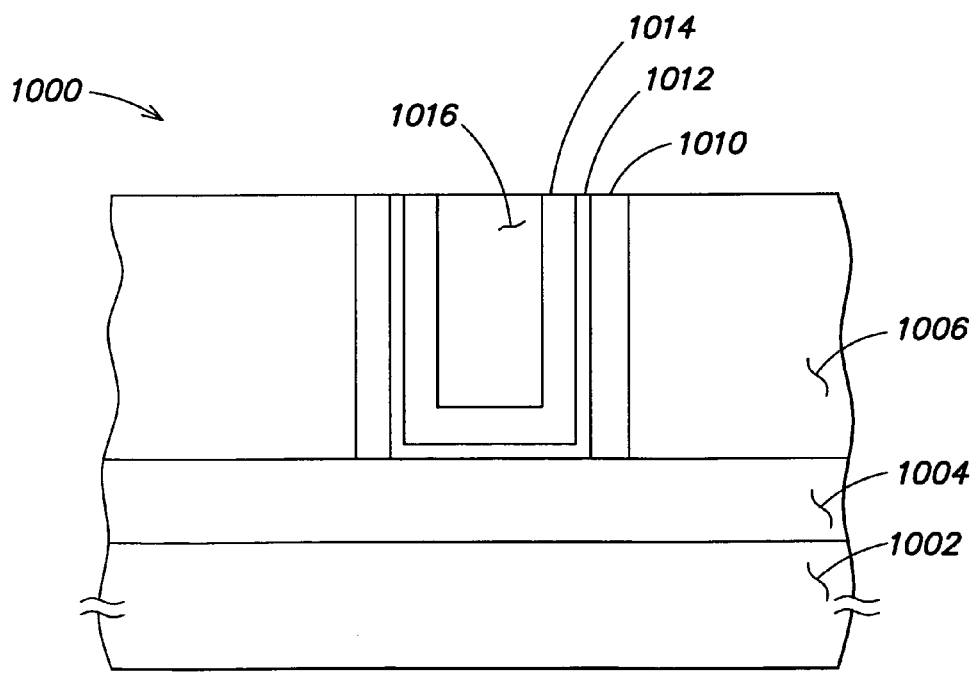

After the seed layer 1014 has been deposited within the via 1008, the via 1008 may be filled and the substrate 1000 may be planarized as shown in FIG. 10F. For example, the substrate 1000 may be transferred to a fill chamber (step 910), such as an electro-chemical plating (ECP) chamber, and filled (e.g., with copper or another suitable material, referred to by reference numeral 1016 in FIG. 10F) in step 911. Thereafter, the substrate 1000 may be planarized (separate substrate transfer and planarization steps not shown in FIG. 9), such as via chemical-mechanical polishing. Following step 911, the process 900 ends at step 912.

By employing atomic layer deposition to deposit the first barrier layer, adequate sidewall coverage may be achieved, even within high aspect ratio vias, to ensure diffusion resistance and mechanical strength (e.g., even when a low K dielectric interlayer is employed). Sputter etching the first barrier layer and employing a second, thinner ALD barrier layer allows a thin bottom barrier layer may be obtained despite the presence of thick sidewall coverage. The use of only ALD barrier layers also improves overall barrier layer uniformity, and decreases deposition on field regions of the substrate. Post metallization process times, such as chemical mechanical polishing times, thereby may be reduced.

The foregoing description discloses only exemplary embodiments of the invention. Modifications of the above disclosed apparatus and methods which fall within the scope of the invention will be readily apparent to those of ordinary skill in the art. For instance, other processes than those described herein may be employed during barrier layer, seed layer or fill layer formation, and/or during planarization. Other processing systems than those described herein may be employed.

It will be understood that the processes 500, 700 and 900 are merely exemplary interconnect formation processes that may be performed within the inventive system 100 of FIGS. 1-4. Other interconnect formation processes also may be performed by the system 100.

The controller 140 (and/or the controllers 330, 476) may contain computer program code, computer program products and/or data structures for performing one or more of the steps of processes 500, 700 or 900.

In the third embodiment of the invention described with reference to FIGS. 9-10F, the first and second ALD deposited barrier layers need not comprise the same material and/or may be deposited in different ALD chambers. In at least one embodiment, the second ALD barrier layer may be thicker or thinner than, or the same thickness as, the first ALD barrier layer.

In any of the embodiments described herein, a thin "flash" layer may be deposited on via sidewalls and/or bottoms prior to seed layer deposition (e.g., about 20-40 angstroms of Ta). Any form of substrate pedestal biasing may be employed (e.g., RF, pulsed DC, DC, etc.).

Figure 11:
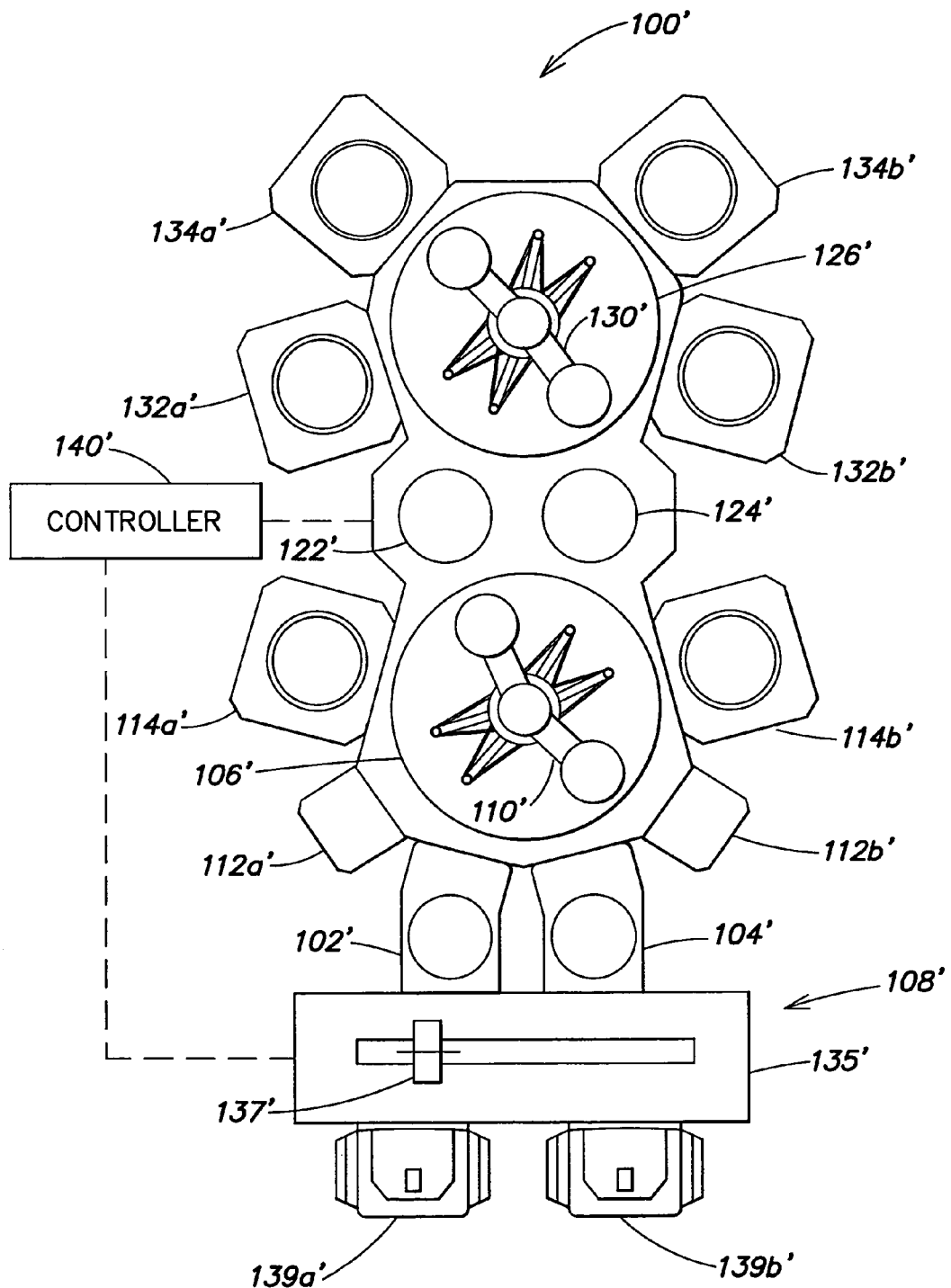
FIG. 11 is a schematic top-view of another exemplary multi-chamber processing system that may be adapted to perform one or more of the inventive processes described herein.

FIG. 11 is a schematic top-view of another exemplary multi-chamber processing system 100' that may be adapted to perform one or more the inventive processes described herein. For example, the processing system 100' may be employed to perform a process similar to the process 500 described previously with reference to FIGS. 5-6E, as well as other processes.

The processing system 100' is similar to the Endura™ Integrated Cu Barrier/Seed (iCuB/S™) System available from Applied Materials, Inc. Other processing systems may be similarly employed.

The processing system 100' generally includes load lock chambers 102', 104' for transferring substrates into and out of the system 100'. Typically, since the system 100' is under vacuum, the load lock chambers 102', 104' are adapted to "pump down" substrates introduced into the system 100 to a suitable vacuum condition. As shown in FIG. 11, the load lock chambers 102', 104' are coupled to a first transfer chamber 106' and to a factory interface 108'.

The transfer chamber 106' includes a first robot 110' that is adapted to transfer substrates between the load lock chambers 102', 104', degas chambers 112a' and 112b' and pre-clean chambers 114a' and 114b'. The first robot 110' also transfers substrates to/from one or more pass-through chambers 122', 124'.

The degas chambers 112a', 112b' and the pre-clean chambers 114a', 114b' may comprise any conventional degas and pre-clean chambers, respectively. In at least one embodiment of the invention, the pre-clean chambers 114a', 114b' comprise Preclean™ XTe chambers available from Applied Materials, Inc.

The pass-through chambers 122', 124' are coupled to a second transfer 126' which houses a second robot 130'. The second robot 1301 is adapted to transfer substrates between the pass-through chambers 122', 124', high density plasma physical vapor deposition (HDPPVD) chambers 132a' and 132b' (both of which are adapted to deposit metal seed layers) and atomic layer deposition (ALD) chambers 134a' and 134b' (both of which are adapted to deposit barrier layers).

The HDPPVD chambers 132a', 132b' and the ALD chambers 134a', 134b' may comprise any conventional HDPPVD seed and ALD barrier layer chambers, respectively. In at least one embodiment of the invention, the HDPPVD chambers 132a', 132b' comprise SIP™ EnCoRe chambers configured for copper seed layer deposition (SIP™ EnCoRe Cu chambers) and available from Applied Materials, Inc.; and the ALD chambers 134a', 134b' comprise Åltra™ ALD chambers configured for tantalum nitride layer deposition (Åltra™ ALD TaN chambers) and also available from Applied Materials, Inc. Other chambers, seed layer materials and/or barrier layer materials may be employed.

Each robot 110', 130' may be adapted to transfer multiple substrates simultaneously and in an independent manner (e.g., a dual blade robot having independently controllable blades) or in a coordinated manner (e.g., a dual blade robot in which one blade retracts as the other blade extends). Such robots are described in U.S. Pat. Nos. 5,789,878 and 6,379,095, both of which are hereby incorporated by reference herein in their entirety. For example, the processing system 100' may be based on an Endura™ XP mainframe and employ XP dual blade robots, available from Applied Materials, Inc.

The factory interface 108' includes a buffer chamber 135' which houses a third robot 137' and which is coupled to a plurality of loadports 139a', 139b'. Each loadport may or may not be configured with pod opening capability for opening sealed substrate carriers. It will understood that in general, any number of robots may be located within the buffer chamber 135', and that any number of loadports may be coupled to the buffer chamber 135'.

The system 100' also may include a controller 140' adapted to control, for example, substrate transfer operations within the transfer chambers 106', 126' and/or the pass-through chambers 122', 124', substrate processing performed within one or more of the chambers 112a', 112b', 114a', 114b', 132a', 132b', 134a', 134b', and the like. In at least one embodiment, the controller 140' is programmed to perform one or more of the inventive processes described herein that may be implemented, for example, as one or more computer program products. The controller 140' may be a system controller, a dedicated hardware circuit, an appropriately programmed general purpose computer, or any other equivalent electronic, mechanical or electromechanical device.

The system 100' allows simultaneous processing of multiple substrates. For example, a process, such as the process 500 of FIG. 5, may be performed on a first substrate using one or more of the chambers 112a', 114a', 132a' and 134a' while the process is simultaneously performed on a second substrate using one or more of the chambers 112b', 114b', 132b' and 134b'. That is, a process may be performed on the first substrate during at least a portion of the time that the same process is performed on the second substrate. Use of independently controllable, dual blade robots increases throughput by allowing substrate transfers for the first substrate to be independent from substrate transfers for the second substrate. Similar systems may be employed with the processes described previously with reference to FIGS. 7-10F.

Accordingly, while the present invention has been disclosed in connection with exemplary embodiments thereof, it should be understood that other embodiments may fall within the spirit and scope of the invention, as defined by the following claims.

The invention claimed is:

1. An integrated system adapted to form a barrier layer on sidewalls and a bottom of a via that extends through a dielectric layer to expose an underlying metal feature of a substrate, the integrated system comprising:
   an atomic layer deposition (ALD) chamber adapted to deposit a conformal, first barrier layer over the sidewalls and bottom of the via;
   a high density plasma physical vapor deposition (HDPPVD) chamber adapted to deposit a second barrier layer on the sidewalls and bottom of the via;
   a transfer chamber coupled to the ALD chamber and adapted to transfer the substrate between the ALD chamber and the HDPPVD chamber under vacuum; and
   at least one controller coupled to the ALD chamber, the transfer chamber and the HDPPVD chamber and adapted to perform the steps of:
   (a) forming a first barrier layer over the sidewalls and bottom of the via using atomic layer deposition within the ALD chamber;
   (b) transferring the substrate from the ALD chamber to the HDPPVD chamber;
   (c) removing at least a portion of the first barrier layer from the bottom of the via by sputter etching the substrate within the HDPPVD chamber using a plasma ion density of at least $10^{10}$ ions/cm$^3$, wherein a bias is applied to the substrate during at least a portion of the sputter etching; and (d) depositing a second barrier layer on the sidewalls and bottom of the via within the HDPPVD chamber.

2. The integrated system of claim 1 wherein the first barrier layer comprises tantalum nitride.

3. The integrated system of claim 2 wherein the first barrier layer has a thickness of between about 5 to 50 angstroms.

4. The integrated system of claim 2 wherein the second barrier layer comprises tantalum.

5. The integrated system of claim 4 wherein the second barrier layer has a thickness of between about 10 to 50 angstroms.

6. The integrated system of claim 1 wherein steps (c) and (d) occur sequentially.

7. The integrated system of claim 1 wherein at least a portion of steps (c) and (d) occur simultaneously.

8. An integrated system adapted to form a barrier layer on sidewalls and a bottom of a via that extends through a dielectric layer to expose an underlying metal feature of a substrate, the integrated system comprising:
    an atomic layer deposition (ALD) chamber adapted to deposit a conformal, tantalum nitride barrier layer over the sidewalls and bottom of the via;
    a high density plasma physical vapor deposition (HDP-PVD) chamber adapted to deposit a tantalum barrier layer on the sidewalls and bottom of the via;
    a transfer chamber coupled to the ALD chamber and adapted to transfer the substrate between the ALD chamber and the HDPPVD chamber under vacuum; and
    at least one controller coupled to the ALD chamber, the transfer chamber and the HDPPVD chamber and adapted to perform the steps of:
        (a) employing the ALD chamber to deposit a conformal tantalum nitride barrier layer on the sidewalls and bottom of the via;
        (b) transferring the substrate through the transfer chamber to a substrate support pedestal of the HDPPVD chamber;
        (c) removing at least a portion of the tantalum nitride barrier layer deposited on the bottom of the via by:
            maintaining a noble-gas containing sub-atmospheric environment of less than about 100 millitorr within the HDPPVD chamber;
            generating a plasma having an ion density of at least $10^{10}$ ions/cm$^3$ within the HDPPVD chamber; and
            applying power to the substrate support pedestal so as to attract at least noble-gas ions to the substrate and resputter at least a portion of the tantalum nitride barrier layer from the bottom of the via; and
        (d) depositing a tantalum barrier layer on the sidewalls and bottom of the via by:
            maintaining a noble-gas containing sub-atmospheric environment of less than about 100 millitorr within the HDPPVD chamber;
            generating a plasma having an ion density of at least $10^{10}$ ions/cm$^3$ within the HDPPVD chamber;
            applying power to a tantalum target of the HDPPVD chamber so as to sputter tantalum atoms from the target;
            ionizing at least a portion of the sputtered tantalum atoms; and
            applying power to the substrate support pedestal so as to attract at least ionized tantalum atoms to the substrate, thereby forming a tantalum barrier layer on the bottom and sidewalls of the via.

9. The integrated system of claim 8 wherein steps (c) and (d) are performed sequentially.

10. The integrated system of claim 8 wherein at least a portion of steps (c) and (d) are performed simultaneously.

11. The integrated system of claim 8 wherein at least one of steps (c) and (d) comprises applying power to a coil disposed between the tantalum target and the substrate support pedestal to increase an ionization density of the plasma.

12. An integrated system adapted to form a barrier layer on sidewalls and a bottom of a via that extends through a dielectric layer to expose an underlying metal feature of a substrate, the integrated system comprising:
    an atomic layer deposition (ALD) chamber adapted to deposit a conformal barrier layer over the sidewalls and bottom of the via;
    a sputter etch chamber adapted to sputter etch the substrate;
    a transfer chamber coupled to the ALD chamber and adapted to transfer the substrate between the ALD chamber and the sputter etch chamber under vacuum; and
    at least one controller coupled to the ALD chamber, the transfer chamber and the sputter etch chamber and adapted to perform the steps of:
        (a) forming a first barrier layer over the sidewalls and bottom of the via using atomic layer deposition within the ALD chamber;
        (b) transferring the substrate from the ALD chamber to the sputter etch chamber;
        (c) removing at least a portion of the first barrier layer from the bottom of the via by sputter etching the substrate within the sputter etch chamber;
        (d) transferring the substrate from the sputter etch chamber back to the ALD chamber; and
        (e) depositing a second barrier layer on the sidewalls and bottom of the via within the ALD chamber.

13. The integrated system of claim 12 wherein the second barrier layer is thinner than the first barrier layer.

14. The integrated system of claim 12 wherein the first barrier layer comprises tantalum nitride.

15. The integrated system of claim 14 wherein the first barrier layer has a thickness of between about 5 to 50 angstroms.

16. The integrated system of claim 14 wherein the second barrier layer comprises tantalum.

17. The integrated system of claim 16 wherein the second barrier layer has a thickness of between about 10 to 50 angstroms.

18. An integrated system adapted to form a barrier layer on sidewalls and a bottom of a via that extends through a dielectric layer to expose an underlying metal feature of a substrate, the integrated system comprising:
    an atomic layer deposition (ALD) chamber adapted to deposit a conformal, first barrier layer over the sidewalls and bottom of the via;
    a sputter etch chamber adapted to sputter etch the substrate;
    a transfer chamber coupled to the ALD chamber and adapted to transfer the substrate between the ALD chamber and the sputter etch chamber under vacuum; and
    at least one controller coupled to the ALD chamber, the transfer chamber and the sputter etch chamber and adapted to perform the steps of:
        (a) employing the ALD chamber to deposit a conformal first tantalum nitride barrier layer on the sidewalls and bottom of the via;
        (b) transferring the substrate through the transfer chamber to the sputter etch chamber;

(c) removing at least a portion of the first tantalum nitride barrier layer on the bottom of the via within the sputter etch chamber;

(d) transferring the substrate through the transfer chamber to the ALD chamber; and (e) depositing a second conformal tantalum nitride barrier layer on the sidewalls and bottom of the via within the ALD chamber, the second tantalum nitride barrier layer being thinner than the first tantalum nitride barrier layer.

19. The integrated system of claim 1 wherein the controller is adapted to perform step (c) using a plasma having a plasma ion density of at least $10^{11}$ ions/cm$^3$ in a bulk region of the plasma.

20. The integrated system of claim 19 wherein the controller is adapted to perform step (c) using a plasma having a plasma ion density of at least $10^{12}$ ions/cm$^3$ in a bulk region of the plasma.

21. The integrated system of claim 8 wherein the controller is configured such that the plasma ion density during step (c) reaches at least $10^{11}$ ions/cm$^3$ in a bulk region of the plasma.

22. The integrated system of claim 21 wherein the controller is configured such that the plasma ion density during step (c) reaches at least $10^{12}$ ions/cm$^3$ in a bulk region of the plasma.

23. The integrated system of claim 8 wherein the controller is configured such that the plasma ion density during step (d) includes a metal ion density of at least $10^{10}$ metal ions/cm$^3$ in a bulk region of the plasma.

24. The integrated system of claim 23 wherein the controller is configured such that the plasma ion density during step (d) includes a metal ion density of at least $10^{11}$ metal ions/cm$^3$ in a bulk region of the plasma.

25. An integrated system adapted to form a barrier layer on sidewalls and a bottom of a via that extends through a dielectric layer to expose an underlying metal feature of a substrate, the integrated system comprising:

a first atomic layer deposition (ALD) chamber adapted to deposit a conformal barrier layer over sidewalls and a bottom of a via of a first substrate;

a first high density plasma physical vapor deposition (HDPPVD) chamber adapted to deposit a seed layer on the sidewalls and bottom of the via of the first substrate;

a second ALD chamber adapted to deposit a conformal barrier layer over sidewalls and a bottom of a via of a second substrate;

a second HDPPVD chamber adapted to deposit a seed layer on the sidewalls and bottom of the via of the second substrate;

a transfer chamber coupled to the first ALD chamber, the first HDPPVD chamber, the second ALD chamber and the second HDPPVD chamber and having a robot adapted to transfer the first substrate between the first ALD chamber and the first HDPPVD chamber and to transfer the second substrate between the second ALD chamber and the second HDPPVD chamber; and at least one controller coupled to the first and second ALD chambers, the first and second HDPPVD chambers and to the robot of the transfer chamber and adapted to perform the steps of:

(a) employing the first ALD chamber to deposit a conformal Ta-containing barrier layer on the sidewalls and bottom of the via of the first substrate, the barrier layer having sufficient thickness to serve as a diffusion barrier to copper atoms;

(b) transferring the first substrate through the transfer chamber to a substrate support pedestal of the first HDPPVD chamber;

(c) removing at least a portion of the barrier layer deposited on the bottom of the via of the first substrate by:

maintaining a noble-gas containing sub-atmospheric environment of less than about 100 millitorr within the first HDPPVD chamber;

generating a plasma having an ion density of at least $10^{10}$ ions/cm$^3$ within the first HDPPVD chamber; and applying power to the substrate support pedestal of the first HDPPVD chamber so as to attract at least noble-gas ions to the first substrate and resputter at least a portion of the barrier layer from the bottom of the via of the first substrate;

(d) depositing a copper seed layer on the sidewalls and bottom of the via of the first substrate by:

maintaining a noble-gas containing sub-atmospheric environment of less than about 100 millitorr within the first HDPPVD chamber;

generating a plasma having an ion density of at least $10^{10}$ ions/cm$^3$ within the first HDPPVD chamber;

applying power to a copper target of the first HDPPVD chamber so as to sputter copper atoms from the target;

ionizing at least a portion of the sputtered copper atoms; and applying power to the substrate support pedestal of the first HDPPVD chamber so as to attract at least ionized copper atoms to the first substrate, thereby forming a copper seed layer on the bottom and sidewalls of the via of the first substrate;

(e) employing the second ALD chamber to deposit a conformal Ta-containing barrier layer on the sidewalls and bottom of the via of the second substrate, the barrier layer having sufficient thickness to serve as a diffusion barrier to copper atoms;

(f) transferring the second substrate through the transfer chamber to a substrate support pedestal of the second HDPPVD chamber;

(g) removing at least a portion of the barrier layer deposited on the bottom of the via of the second substrate by:

maintaining a noble-gas containing sub-atmospheric environment of less than about 100 millitorr within the second HDPPVD chamber;

generating a plasma having an ion density of at least $10^{10}$ ions/cm$^3$ within the second HDPPVD chamber; and applying power to the substrate support pedestal of the second HDPPVD chamber so as to attract at least noble-gas ions to the second substrate and resputter at least a portion of the barrier layer from the bottom of the via of the second substrate; and (h) depositing a copper seed layer on the sidewalls and bottom of the via of the second substrate by:

maintaining a noble-gas containing sub-atmospheric environment of less than about 100 millitorr within the second HDPPVD chamber;

generating a plasma having an ion density of at least $10^{10}$ ions/cm$^3$ within the second HDPPVD chamber;

applying power to a copper target of the second HDPPVD chamber so as to sputter copper atoms from the target;

ionizing at least a portion of the sputtered copper atoms; and applying power to the substrate support pedestal of the second HDPPVD chamber so as to attract at least ionized copper atoms to the second substrate, thereby forming a copper seed layer on the bottom and sidewalls of the via of the second substrate.

26. The integrated system of claim 25 wherein the at least one controller is adapted to perform steps (a)-(d) and steps (e)-(h) simultaneously.

27. The integrated system of claim 25 wherein the at least one controller is configured such that the plasma ion density during each of steps (c) and (g) reaches at least $10^{11}$ ions/cm$^3$ in a bulk region of the plasma.

28. The integrated system of claim 27 wherein the at least one controller is configured such that the plasma ion density during each of steps (c) and (g) reaches at least $10^{12}$ ions/cm$^3$ in a bulk region of the plasma.

29. The integrated system of claim 25 wherein the at least one controller is configured such that the plasma ion density during each of steps (d) and (h) includes a metal ion density of at least $10^{10}$ metal ions/cm$^3$ in a bulk region of the plasma.

30. The integrated system of claim 29 wherein the at least one controller is configured such that the plasma ion density during each of steps (d) and (h) includes a metal ion density of at least $10^{11}$ metal ions/cm$^3$ in a bulk region of the plasma.

* * * * *